United States Patent [19]
Kinoshita et al.

[11] Patent Number: 5,578,861
[45] Date of Patent: Nov. 26, 1996

[54] SEMICONDUCTOR DEVICE HAVING REDUNDANT CIRCUIT

[75] Inventors: Mitsuya Kinoshita; Atsushi Hachisuka; Kazuhiro Tsukamoto, all of Hyogo, Japan

[73] Assignee: Mitsubishi Denki Kabushiki Kaisha, Tokyo, Japan

[21] Appl. No.: 357,298

[22] Filed: Dec. 13, 1994

[30]  Foreign Application Priority Data

Dec. 28, 1993  [JP]  Japan ................................ 5-338414

[51] Int. Cl.⁶ ........................... H01L 27/10; H01L 23/62; H01L 29/00
[52] U.S. Cl. ........................ 257/529; 257/209; 257/356
[58] Field of Search .................................. 257/529, 665, 257/355, 356; 365/225.7

[56]  References Cited

U.S. PATENT DOCUMENTS 5,444,012   8/1995  Yoshizumi et al. ..................... 437/60

*Primary Examiner*—Sara W. Crane
*Assistant Examiner*—Valencia Martin Wallace
*Attorney, Agent, or Firm*—Lowe, Price, LeBlanc & Becker

[57]  ABSTRACT

In a semiconductor device, a connection conductive layer is formed by patterning on a p-type semiconductor substrate. A silicon nitride film is formed on the connection conductive layer with an insulating layer. A silicon oxide film is formed on the silicon nitride film. The silicon oxide film is provided with a hole. The silicon nitride film is exposed at a bottom of the hole. The hole is located immediately above the connection conductive layer. Thereby, a thickness of the insulating layer on a fuse element which can be blown can be controlled easily in the semiconductor device.

9 Claims, 37 Drawing Sheets

SEMICONDUCTOR DEVICE HAVING REDUNDANT CIRCUIT

BACKGROUND OF THE INVENTION

1. Field of the Invention

The present invention relates to a semiconductor device and a method of manufacturing the same, and in particular to a semiconductor device having a redundant circuit and a method of manufacturing the same.

2. Description of the Background Art

In general, semiconductor devices such as an SRAM (Static Random Access Memory) and a DRAM (Dynamic Random Access Memory) are internally provided with redundant circuits. The redundant circuits are provided for the purpose of preventing reduction of yield of the semiconductor devices which may be caused by random defects generating in the process of manufacturing the semiconductor devices. More specifically, the redundant circuit portion is provided as a spare circuit portion having the same function as a specific circuit portion so that the specific circuit portion which has a defect caused during manufacturing may be replaced with the redundant circuit portion to maintain the function of the whole semiconductor device.

Description will not be given on a concept of the structure of the semiconductor device provided with the redundant circuit portion.

FIG. 43 is a plan showing a wafer in which semiconductor devices having conventional redundant circuits are individually formed as chips. FIG. 44 is a plan schematically showing an internal structure of the semiconductor device having the redundant circuit in each chip.

Referring first to FIG. 43, a wafer 1000 is provided with a plurality of chips (semiconductor devices) 500.

Referring to FIG. 44, each chip 500 is provided with blocks N1, N2, ..., Nm having the same function. For example, each block is formed of a plurality of memory cells having the same function in the semiconductor device.

There are provided a plurality of fuses L1, L2, ..., Lm which can be blown for deactivating blocks N1, N2, ..., Nm, respectively. A redundant block S having the same function as the block is formed for replacing deactivated one among blocks N1, N2, ..., Nm with the same.

A field effect transistor 581 has a gate electrode to which a potential of a ground power supply 579 is applied via a fuse Ls. Thereby, the field effect transistor 581 is maintained at the off state. Therefore, redundant block S is electrically isolated in chip 500.

In order to detect possible defects of blocks N1, N2, ..., Nm, a pad portion P is provided with pad electrodes 571 and 573 for test.

Function test of the semiconductor device thus constructed will be described below.

More specifically, processing with a laser beam spot, i.e., so-called laser beam trimming (will be merely referred to as "LT") will be described below.

First an electric signal is applied to an unillustrated function tester (will be also referred to merely as "tester") via test pad electrodes 571 and 573 at pad portion P. If chip 500 is normal, an expected signal corresponding to the applied electric signal is output from test pad electrode 573. At this time, normality/failure of chip 500 is determined based on a correlation between the electric signal applied to chip 500 and the output electric signal. If defective block is found among blocks N1, N2, ..., Nm, the defective block is replaced with redundant block S. Thereby, chip 500 can maintain the originally intended function for making the chip 500 acceptable.

The defective block is replaced with redundant block S in the following manner.

If a defect is detected, for example, in block N1 by the above function test, information relating to fuzes L1 and Ls in chip 500 such as a defect address or position coordinate (i.e., replacement information) in the chip is applied to an LT processing device. This LT processing device radiates a laser beam to a position determined on the basis of the applied replacement information. Thereby, fuses L1 and Ls are fused and removed to isolate the defective block N1 in chip 500.

Since fuse Ls is fused, a voltage of a power supply 575 is applied to the gate electrode of field effect transistor 581 via a resistance 577. Thereby, field effect transistor 581 is turned on, and defective block N1 is replaced with redundant block S.

Description will now be given on a DRAM as an example of the semiconductor device having the redundant circuit described above, and particularly a case where the block having a specific function is a memory cell array.

FIG. 45 schematically shows a conventional structure of a memory cell array of a DRAM. Referring to FIG. 45, a memory cell array 560 includes a plurality of word lines WL extending in the row direction from row decoders 561 via word drivers 563, respectively. A plurality of bit lines BL extend in the column direction from column decoders 565, respectively. Word lines WL and bit lines BL cross each other. Memory cells MC are disposed at crossings of them.

At the outside of word lines WL, a spare word line SWL extends in the row direction from a spare decoder 567 via a spare word driver 569. A spare memory cell SMC is disposed at a crossing of spare word line SWL and each bit line BL.

Spare word line SWL, spare decoder 567 and spare word driver 569 form a so-called redundant circuit.

Then, description will be given on a test of memory circuit characteristics of the DRAM and a method of repairing a defect with the redundant circuit.

FIG. 46 is a plan conceptually showing an example of the redundant circuit in the DRAM. Referring to FIG. 46, a DRAM operation test is first performed, e.g., with a tester to detect a defective bit MC1 in memory cell 560. Then, the LT processing is performed to blow out a fuze FU1 of a word line WL1 containing defective bit MC1, so that defective word line WL1 is isolated from the circuit.

Then, a fuse SFU connected to spare line SWL of the redundant circuit is blown in an appropriate combined manner with the LT processing. Thereby, such a circuit is formed that spare line SWL operates only when an externally applied signal is a signal selecting defective bit MC1.

In this manner, the spare line contained in the redundant circuit is connected to the regular line, whereby the DRAM having the defective portion is repaired to form the acceptable DRAM.

The semiconductor device having the conventional fuses will now be described below.

FIG. 47 is a cross section schematically showing the structure of the conventional semiconductor device. FIG. 48 is a cross section showing a peripheral structure of the fuse in FIG. 47. Referring to FIGS. 47 and 48, an element isolating oxide film 503 having a predetermined configuration is formed at a surface of a semiconductor substrate 501.

A plurality of MOS (Metal Oxide Semiconductor) transistors 540 are formed at regions isolated by element isolating oxide film 503.

Each MOS transistor 540 has a pair of source/drain regions 541, a gate insulating film 543 and a gate electrode 545. Paired source/drain regions 541 are formed at the surface of p-type semiconductor substrate 501 with a predetermined space between each other. Source/drain regions 541 have a so-called LDD (Lightly Doped Drain) structure, i.e., a two-layer structure including an $n^-$-impurity region 541a of a relatively low concentration and an $n^+$-impurity region 541b of a relatively high concentration. Gate electrode 545 is formed on a region between paired source/drain regions 541 with a gate insulating film 543 therebetween.

An insulating layer 547 is formed on each gate electrode 545. Side walls of gate electrode 545 are covered with side wall insulating layers 549.

Conductive layers 505 are in contact with source/drain regions 541. Particularly, conductive layer 505 making connection between source/drain regions 541 of different MOS transistors 540 is used as a fuse element.

Each conductive layer 505 other than the fuse element is connected to conductive layers 553a or 553b via plug layers 551a or 551b. Each conductive layers 505 is covered with an insulating film 511 made of a silicon oxide film and formed on p-type semiconductor substrate 501. A hole 511a is formed in insulating layer 511. Hole 511a is located immediately above fuse element 505a, and has a bottom spaced from fuse element 505a by a predetermined distance.

A plurality of aluminum interconnection layers 530 are formed on the surface of insulating layer 511.

Then, description will be given on a method of manufacturing a peripheral structure of the fuse element shown in FIG. 48.

FIGS. 49 and 50 are schematic cross sections showing the peripheral structure of the fuse at one and subsequent steps in the process of manufacturing the conventional semiconductor device. Referring to FIG. 49, insulating layer 503 for element separation and others is formed at the surface of p-type semiconductor substrate 501. Conductive layer 505 which has a predetermined configuration and will form the fuse element is formed on the surface of insulating layer 503. Insulating layer 511 is formed to cover conductive layer 505 forming the fuse element.

Referring to FIG. 50, a resist pattern (not shown) having a predetermined configuration is formed on insulating layer 511. Using this resist pattern as a mask, etching is effected on insulating layer 511. This etching forms hole 511a in insulating layer 511. Hole 511a thus formed is located immediately above conductive layer 505 forming the fuse element, and has the bottom spaced from fuse element 505 spaced by a predetermined distance $d_{20}$.

The fuse element is a portion formed on the assumption that it may be cut in a circuit pattern. The cut of the circuit pattern is performed, e.g., by radiation of a laser beam as already described. Now, the LT processing for cutting the circuit pattern by radiation of the laser beam will be specifically described below.

FIGS. 51 and 52 are schematic cross sections showing a peripheral structure of the fuse element at one and subsequent steps in the LT process. Referring first to FIG. 51, when a defective portion is detected in the circuit, a laser beam 20 is radiated to fuse element 505 provided at the redundant circuit through hole 511a. Laser beam 20 passes through insulating layer 511 and reaches fuse element 505.

Referring to FIG. 52, fuse element 505 absorbs the heat generated by laser radiation to melt. When the fuse element is melting, a pressure increases in accordance with rapid increase of a temperature particularly at an upper portion of fuse 505, so that insulating layer 511 located above fuse element 505 is blown off. Thereby, the pressure lowers substantially to the atmospheric pressure, and simultaneously the melted fuse element 505 vaporizes. Thereafter, fragments of fuse element 505 are removed by etching, so that cut of the circuit pattern is completed.

Fuse 505 thus blown is also shown in a perspective view of FIG. 53.

In recent years, there has been tendency that interconnection layers in semiconductor devices are formed of multiple layers for improving density and degree of integration. If the interconnection layers are formed of the multiple layers, interlayer insulating layers insulating the respective interconnection layers have a multi-layer structure. This significantly increases a sum of film thicknesses of the interlayer insulating layers insulating the respective layers. More specifically, a film thickness $t_0$ of insulating layer 511 shown in FIG. 47 goes to about 20000Å.

Meanwhile, film thickness $d_{20}$ of insulating layer 511 on fuse element 505a must be substantially 5000Å in order to allow accurate blowing of the fuse with the laser beam. Therefore, it is necessary to provide hole 511a in insulating layer 511 for controlling the film thickness of insulating layer 511 on fuse element 505a.

Meanwhile, insulating layer 511 in the conventional semiconductor device has a very large film thickness of 20000Å due to the multi-layer structure of interconnection layers. Therefore, hole 511a must be deep in order to attain the intended film thickness of insulating layer 511 on fuse element 505a. Therefore, it is difficult to control the depth of hole 511a, resulting in large fluctuation of film thickness $d_{20}$ of insulating layer 511 on element 505a.

An amount to be etched can be controlled with an accuracy of, e.g., ±10%. Therefore, if an intended depth of hole 511a is 5000Å, actually formed hole 511a has the depth from 4500 to 5500Å. Meanwhile, if the intended depth of hole 511a is 15000Å, actually formed hole 511a has the depth from 13500 to 16500Å. As described above, although an absolute value of fluctuation is 1000Å if the depth is 5000Å, the absolute value of fluctuation goes to a large value of 3000Å if the depth is 15000Å. Further, fluctuation is caused also when forming insulating layer 511. For example, if insulating layer 511 is formed with a fluctuation of ±10%, the absolute value of fluctuation goes to 4000Å when the intended film thickness of insulating layer 511 is 20000Å, so that the possible fluctuation of film thickness $d_{20}$, which is a sum of the fluctuation caused by formation of insulating layer 511 and the absolute value of 3000Å of the above fluctuation caused by the etching, goes up to 7000Å.

If the fluctuation of film thickness $d_{20}$ of insulating layer 511 is large, following disadvantages are caused. These disadvantages will be specifically described below in connection with individual cases that (1) film thickness $d_{20}$ is larger than the intended value and that (2) it is smaller than the intended value.

(1) In the case of large film thickness $d_{20}$ (i) FIG. 54 shows a disadvantage caused when film thickness $d_{20}$ is larger than the intended thickness. Referring to FIG. 54, when blowing fuse element 505, insulating layer 511 on fuse element 505 is blown off to form a concavity or crater 515. Crater 515 diverges upwardly. Therefore, if insulating layer 511 is thick, crater 515 has a very large open diameter and thus may reach interconnection layer 530. If crater 515 reaches interconnection layer 530, interconnection layer 530 is damaged or broken, resulting in low reliability in electrical connection of the semiconductor device.

(ii) Referring to FIG. 48, insulating layer 511 on fuse element 505 is blown off by the increased pressure of fuse element 505. However, if insulating layer 511 on fuse element 505 is excessively thick, insulating layer 511 cannot be blown off by the increased pressure of fuse element 505 in some cases. In this case, fuse element 505 cannot be cut by melting and removing the same, so that fuse element 505 does not function as the fuse.

(2) In the case of small film thickness $d_{20}$ (i) FIG. 55 shows a disadvantage caused when film thickness $d_{20}$ is smaller than the intended thickness. Referring to FIG. 55, if film thickness $d_{20}$ is excessively small or fuse element 505 is exposed, the energy applied by laser beam 20 is easily taken into ambient air. Therefore, fuse element 505 cannot efficiently store the energy, and thus fuse element 505 is unlikely to melt and vaporize. Therefore, it becomes difficult to blow out fuse element 505, and thus fuse element 505 does not function as fuse.

(ii) If insulating layer 511 has film thickness $d_{20}$ of 0 and thus does not cover fuse element 505, fuse elements 505 not to be cut are also blown. This will be described below.

FIG. 56 is a schematic cross section showing several fuse elements exposed through holes. Referring to FIG. 56, one of exposed fuse elements 505 is blown by the laser. The aforementioned etching is performed to remove residue of blown fuse element 505. However, fuse elements 505 other than that blown by the laser are also exposed through insulating layer 511, so that they are simultaneously etched during the etching for removing the residue. As a result, this etching for removing the residue cuts fuse elements 505 not to be blown by the laser.

SUMMARY OF THE INVENTION

An object of the invention is to provide a semiconductor device having a redundant circuit which allows easy control of a thickness of an insulating layer on a fuse to be blown, and a method of manufacturing the same.

A semiconductor device having a redundant circuit and a method of manufacturing the same according to the invention which have the following features are based on a structure, which includes a specific circuit portion having at least a predetermined function and a redundant circuit for spare use having the same function as the specific circuit portion, and is provided with a connection portion to be fused and removed for replacing the specific circuit portion, if defective, with the redundant circuit.

A method of manufacturing a semiconductor device having a redundant circuit according to one aspect of the invention includes the following steps.

First, a connection conductive layer allowing fusion and removal is formed by patterning on a main surface of a semiconductor substrate. A patterned silicon nitride film is formed on the connection conductive layer. A silicon oxide film is formed to cover the silicon nitride film. The silicon oxide film is etched to expose a surface of the silicon nitride film, whereby a hole is formed immediately above the connection conductive layer.

In the method of manufacturing the semiconductor device having the redundant circuit according to the above aspect of the invention, the silicon nitride film and the silicon oxide film are formed in a layered fashion on the connection conductive layer forming a fuse element. By selecting the etching conditions, a large etching select ratio can be ensured with respect to the silicon nitride film and the silicon oxide film. Therefore, the silicon nitride film is hardly etched even if the silicon oxide film is etched up to an extent that the surface of the silicon nitride film is exposed. Therefore, by setting the film thickness of the silicon nitride film to an intended value, the film thickness of the insulating layer on the connection conductive layer can be easily controlled.

A semiconductor device having a redundant circuit according to one aspect of the invention includes a semiconductor substrate, a connection conductive layer, a silicon nitride film and a silicon oxide film. The semiconductor substrate has a main surface. The connection conductive layer allowing fusion and removal is formed by patterning on the main surface of the semiconductor substrate. The silicon nitride film is formed on the connection conductive layer. The silicon oxide film is formed on the main surface of the semiconductor substrate such that it is located immediately above the connection conductive layer and has a hole reaching the surface of the silicon nitride film.

In the semiconductor device having the redundant circuit according to the above aspect, the silicon nitride film is formed on the connection conductive layer. Since the silicon nitride film has higher resistance against moisture than the silicon oxide film. Therefore, moisture entering the upper portion is prevented from further advancing to the connection conductive layer by the silicon nitride film. Therefore, corrosion of the connection conductive layer by moisture is suppressed, which improves reliability in the electric connection. Such a disadvantage can also be prevented that, after the connection conductive layer is cut, portions of the cut connection conductive layer are short-circuited by moisture.

A method of manufacturing a semiconductor device having a redundant circuit according to another aspect of the invention includes the following steps.

A connection conductive layer allowing fusion and removal is formed by patterning on a main surface of a semiconductor substrate. A first insulating layer is formed on the connection conductive layer. A conductive layer made of material having etching characteristics different from those of the first insulating layer is formed by patterning on the first insulating layer. A second insulating layer made of material having etching characteristics different from those of the conductive layer is formed to cover the conductive layer. The second insulating layer is etched up to an extent that a surface of the conductive layer is partially exposed, and thereby a first hole having a bottom surface located within a surface region of the conductive layer is formed. The patterned conductive layer is entirely removed by effecting etching through the first hole, and thereby a second hole having an open diameter larger than that of the first hole is formed.

In the method of manufacturing the semiconductor device having the redundant circuit according to the above aspect of the invention, the first insulating layer and the conductive layer are formed in a layered fashion on the connection conductive layer forming a fuse element. Since a two-layer structure formed of a silicon nitride film and a silicon oxide film is employed, a large etching select ratio can be ensured between these two layers by appropriately selecting etching conditions. Therefore, even if the conductive layer is removed by the etching to an extent that the surface of the first insulating layer is exposed, the first insulating layer is hardly etched. Accordingly, by setting a film thickness of the first insulating layer to an intended value, a film thickness of the insulating layer on the connection conductive layer can be controlled easily.

Further, according to the above method, the patterned conductive layer is entirely removed by the etching when forming the second hole. It may be possible to form the second hole by removing only a portion of the conductive layer and remaining the other portion without removing the whole conductive layer. In this case, however, residue generated when cutting the connection conductive layer may make connection between the remaining conductive layer and the cut connection conductive layer. In this case, the remaining conductive layer may short-circuit portions of the cut connection conductive layer. Thus, the remaining conductive layer short-circuits the portions of the cut connection conductive layer, although these portions were isolated from each other by the cutting.

According to the invention, however, the conductive layer is entirely removed, so that the conductive layer does not remain, and thus short-circuit of the connection conductive layer by the remaining conductive layer is prevented.

A semiconductor device having a redundant circuit according to another aspect of the invention includes a semiconductor substrate, a connection conductive layer and an insulating layer. The semiconductor substrate has a main surface. The connection conductive layer which can be fused and cut is formed by patterning on the main surface of the semiconductor substrate. The insulating layer is formed on the main surface of the semiconductor substrate to cover the connection conductive layer, and has a hole having a bottom located immediately above the connection conductive layer with a predetermined distance therebetween. The hole has an open end at an upper surface of the insulating layer. An open diameter of the hole at the open end is smaller than a diameter of the same at its bottom.

In the semiconductor device having the redundant circuit according to the above aspect of the invention, the diameter of the hole at its bottom is larger than the open diameter at the open end. This structure of the hole allows such design that the diameter at the bottom of the hole is larger than an open diameter of a crater formed when blowing out a fuse, even if high integration is taken into consideration. Thereby, the open diameter of the crater can be within a range defined by the bottom of the hole. Therefore, the crater reaches only the bottom of the hole and does not extend up to the upper surface of the insulating layer. Therefore, even if an interconnection layer is formed at the upper surface of the insulating layer, the crater does not reach the interconnection layer. Accordingly, the crater neither damage nor break the interconnection layer.

A method of manufacturing a semiconductor device having a redundant circuit according to still another aspect of the invention includes the following steps.

A connection conductive layer which can be fused and removed is formed by patterning on a main surface of a semiconductor substrate. A first insulating layer is formed on the connection conductive layer. A conductive layer made of material having etching characteristics different from those of the first insulating layer is formed on the first insulating layer. A second insulating layer made of material having etching characteristics different from those of the conductive layer is formed to cover the conductive layer. The second insulating layer is etched up to an extent that a surface of the conductive layer is partially exposed, and thereby a first hole is formed. The conductive layer is etched through the first hole up to an extent that a surface of the first insulating layer is exposed, and thereby a second hole communicated with the first hole and having a side wall exposing a side surface of the conductive layer is formed. A third insulating layer is formed to cover inner walls of the first and second holes. The third insulating layer is anisotropically etched up to an extent that a bottom of the second hole is exposed, and thereby a side wall insulating layer covering the side surface of the conductive layer and faced to the side wall of the second hole is formed.

In the method of manufacturing the semiconductor device having the redundant circuit according to the above aspect of the invention, the first insulating layer and the conductive layer are formed in a layered fashion on the connection conductive layer forming a fuse element. Since a two-layer structure formed of the first insulating layer and the conductive layer is employed, a large etching select ratio can be ensured between these two layers by appropriately selecting etching conditions. Therefore, even if the conductive layer is etched to an extent that the surface of the first insulating layer is exposed, the first insulating layer is hardly etched. Accordingly, by setting a film thickness of the first insulating layer to an intended value, a film thickness of the insulating layer on the connection conductive layer can be controlled easily.

A semiconductor device having a redundant circuit according to yet another aspect of the invention includes a semiconductor substrate, a connection conductive layer, an insulating layer, a conductive layer and a side wall insulating layer. The semiconductor substrate has a main surface. The connection conductive layer which can be fused and removed is formed by patterning on the main surface of the semiconductor substrate. The insulating layer is formed on the main surface of the semiconductor substrate to cover the connection conductive layer, and has a hole having a bottom located immediately above the connection conductive layer with a predetermined distance therebetween. The conductive layer has a surface extending around and faced to a side wall of the hole. The side wall insulating layer is formed on a portion of the bottom surface of the hole and covers the side wall of the hole.

In the semiconductor device having the redundant circuit according to the above aspect of the invention, the side wall insulating layer covers the surface of the conductive layer faced the side wall of the hole. Therefore, the surface of the conductive layer is not exposed when cutting the connection conductive layer. Therefore, residue of the connection conductive layer which is blown off when cutting the connection conductive layer does not make electrical connection between the connection conductive layer and the conductive layer. Accordingly, short-circuit of the cut connection conductive layer by the residue of the connection conductive layer and the conductive layer is prevented.

A method of manufacturing a semiconductor device having a redundant circuit according to further another aspect of the invention includes the following steps.

A connection conductive layer allowing fusion and removal is formed by patterning on a main surface of a semiconductor substrate. A first insulating layer is formed to cover the connection conductive layer. An etching stopper layer made of material having etching characteristics different from those of the first insulating layer is formed on the first insulating layer and is located immediately above the connection conductive layer. A second insulating layer made of material having etching characteristics different from those of the etching stopper layer is formed on the first insulating layer, and thereby an upper surface and a side surface of the etching stopper layer are covered by the second insulating layer. The second insulating layer is selectively etched to expose the upper surface and the side wall of the etching stopper layer and a portion of the surface of the first insulating layer, and the exposed first insulating layer is etched using the etching stopper layer as a mask to form a hole in the first and second insulating layer. The etching stopper layer is etched and removed through the hole.

In the method of manufacturing the semiconductor device having the redundant circuit according to the above aspect of the invention, the first insulating layer and the etching stopper layer are formed in a layered fashion on the connection conductive layer forming a fuse element. Since a two-layer structure formed of the first insulating layer and the etching stopper layer is employed, a large etching select ratio can be ensured between these two layers by appropriately selecting etching conditions. Therefore, even if the etching stopper layer is etched to an extent that the surface of the first insulating layer is exposed, the first insulating layer is hardly etched. Accordingly, by setting a film thickness of the first insulating layer to an intended value, a film thickness of the insulating layer on the connection conductive layer can be controlled easily.

A semiconductor device having a redundant circuit according to a further aspect of the invention includes a semiconductor substrate, a connection conductive layer, an insulating layer, and an insulating layer. The semiconductor substrate has a main surface. The connection conductive layer which can be fused and removed is formed by patterning on the main surface of the semiconductor substrate. The insulating layer is formed on the main surface of the semiconductor substrate to cover the connection conductive layer, and has a hole having a bottom located immediately above the connection conductive layer with a predetermined distance therebetween. A bottom of the hole has a convexity and a concavity. The convexity is spaced by a first distance from the connection conductive layer. The concavity surrounds the convexity and is spaced from the connection conductive layer by a second distance smaller than the first distance.

A semiconductor device having a redundant circuit according to still a further aspect of the invention, it is preferable that the insulating film is thick at a portion receiving a radiated laser beam from the viewpoint of energy loss during laser beam radiation. Meanwhile, it is preferable that the insulating layer is thin around the connection conductive layer from the viewpoint that the insulating layer must be blown off when disconnecting the connection conductive layer. For these reasons, the thick portion (convexity) is provided for receiving the radiated laser beam, and the convexity is surrounded by the thin portion (concavity), whereby the energy loss of the laser beam is suppressed, and the insulating layer on the connection conductive layer can be blown off easily. Thus, owing to the foregoing configuration of the bottom of the hole, it is possible to reduce the energy consumption for disconnecting the connection conductive layer.

A method of manufacturing a semiconductor device having a redundant circuit according to yet a further aspect of the invention includes the following steps.

A connection conductive layer which can be fused and removed is formed by patterning on a main surface of a semiconductor substrate. A first insulating layer is formed on the main surface of the connection conductive layer to cover the first insulating layer. The first insulating layer is selectively etched up to an extent that a surface of the connection conductive layer is exposed, and thereby a hole is formed at the first insulating layer. A second insulating layer is formed to cover the exposed surface of the connection conductive layer.

In the method of manufacturing the semiconductor device having the redundant circuit according to the above aspect of the invention, the film thickness of the insulating layer on the connection conductive layer is controlled by forming the second insulating layer on the connection conductive layer. The second insulating layer can be formed by a method such as a CVD method, of which controllability is generally better than that of the etching. Therefore, the film thickness of the insulating layer on the connection conductive layer can be controlled easily.

A semiconductor device having a redundant circuit according to a further aspect of the invention includes a semiconductor substrate, a connection conductive layer, an insulating layer, a first insulating layer and a second insulating layer. The semiconductor substrate has a main surface. The connection conductive layer which can be fused and removed is formed by patterning on the main surface of the semiconductor substrate. The first insulating layer is formed on the main surface of the semiconductor substrate and has a hole. At a bottom of the hole, a surface of the connection conductive layer is protruded from the first insulating layer. The second insulating layer is formed to cover the protruded surface of the connection conductive layer.

In the semiconductor device having the redundant circuit according to the above aspect of the invention, the insulating layer on the connection conductive layer has a film thickness within a predetermined range. Therefore, the connection conductive layer can be cut appropriately.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will be described below with reference to the drawings.

Embodiment 1

Figure 1A:
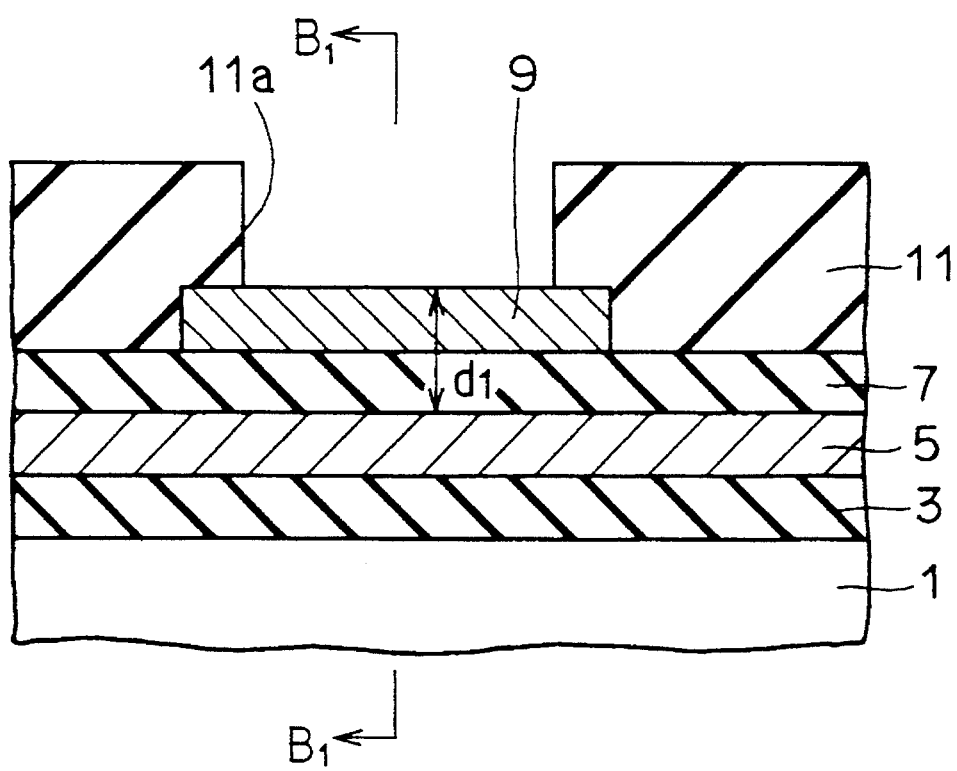
FIGS. 1A and 1B are cross sections schematically showing a structure of a semiconductor device of a first embodiment of the invention.
Figure 1B:
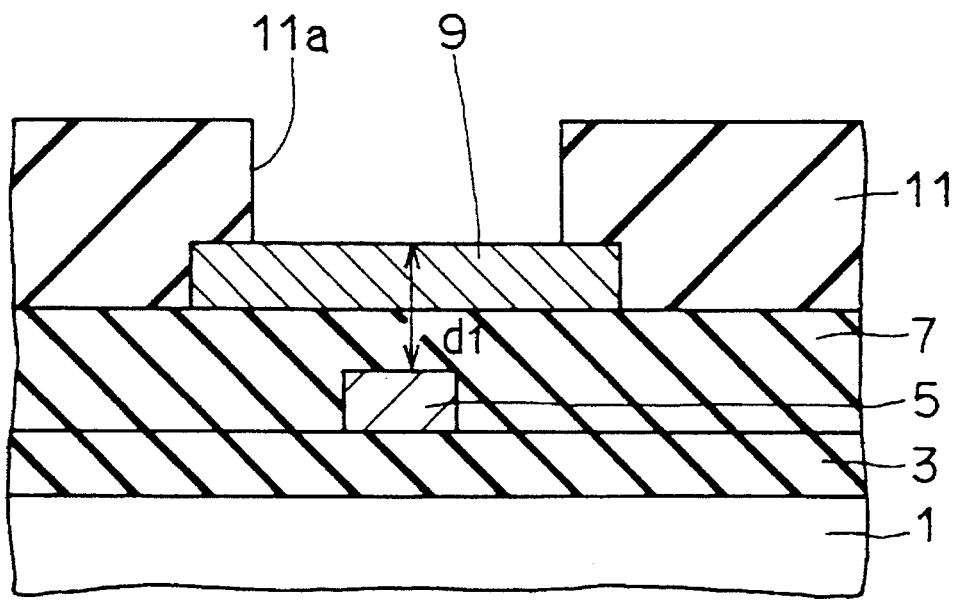

Referring to FIGS. 1A and 1B, an insulating layer 3 forming, e.g., an element isolating oxide film is formed on a p-type semiconductor substrate 1. A patterned connection conductive layer 5 which will form fuse elements and is made of, e.g., polycrystalline silicon is formed on the surface of insulating layer 3. Connection conductive layer 5 is covered with an insulating layer 7 made of, e.g., a silicon oxide film. A patterned silicon nitride film 9 is formed on the surface of insulating layer 7. A silicon oxide film 11 is formed on silicon nitride film 9. Silicon oxide film 11 is provided with a hole 11a through which the surface of silicon nitride film is partially exposed. Hole 11a is located immediately above the connection conductive layer 5.

A method of manufacturing the semiconductor device of this embodiment will now be described below.

Figure 2:
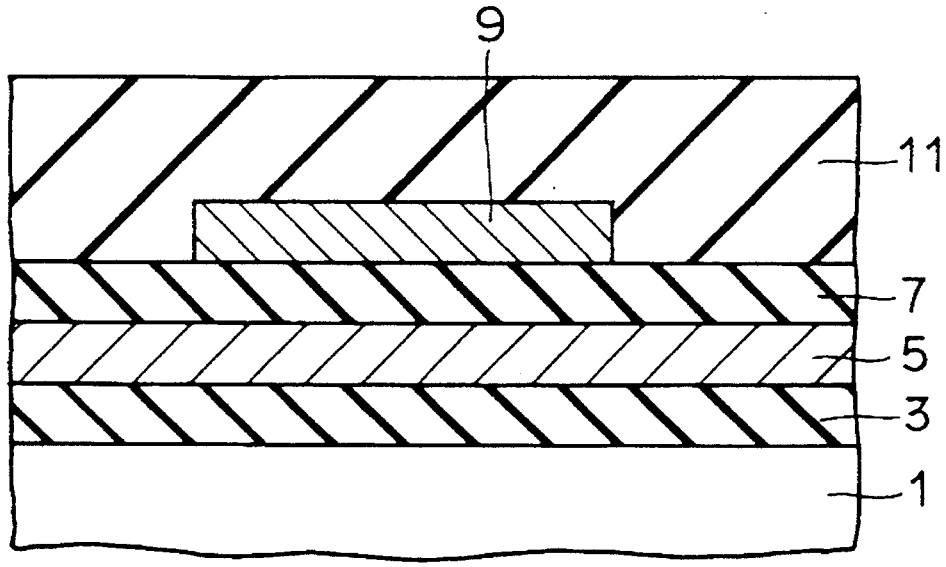
FIGS. 2–4 are schematic cross sections showing a method of manufacturing the semiconductor device of the first embodiment of the invention in accordance with the order of steps.

Referring first to FIG. 2, insulating layer 3 made of, e.g., the element isolating oxide film is formed on the surface of p-type semiconductor substrate 1. Polycrystalline silicon layer 5 or the like is formed on insulating layer 3. Polycrystalline silicon layer 5 is patterned by photolithography and etching technique to form connection conductive layer 5 connecting elements (not shown).

Insulating layer 7 made of, e.g., the silicon oxide film is formed over connection conductive layer 5 by the CVD (Chemical Vapor Deposition) method. Silicon nitride film 9 is formed on silicon oxide film 7, e.g., by the CVD method. Silicon nitride film 9 is patterned into an intended configuration by the photolithography and etching technique. Silicon oxide film 11 is formed to cover silicon nitride film 9, e.g., by the CVD method.

Figure 3:
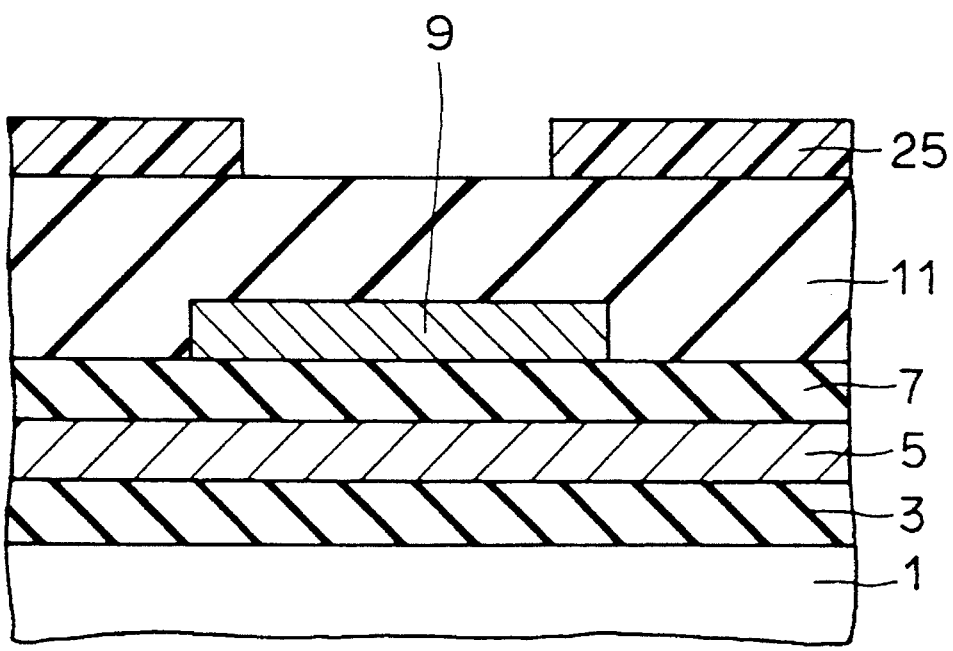

Referring to FIG. 3, a resist pattern 25 having an intended configuration is formed on silicon oxide film 11. Using this resist pattern 25 as a mask, anisotropic etching is effected on insulating layer 11 up to an extent that the surface of silicon nitride film 9 is exposed.

In the case where insulating layer 11 is the silicon oxide film, this etching is performed by an etching device of a parallel plate type under the conditions that an etching gas flow ratio $CHF_3/Ar$ is approximately 1:10, the pressure is from 10 to 100 mTorr and the RF output is from 300 to 700 W. The select ratio between the silicon oxide film and the silicon nitride film under these conditions is 3 or more.

Figure 4:
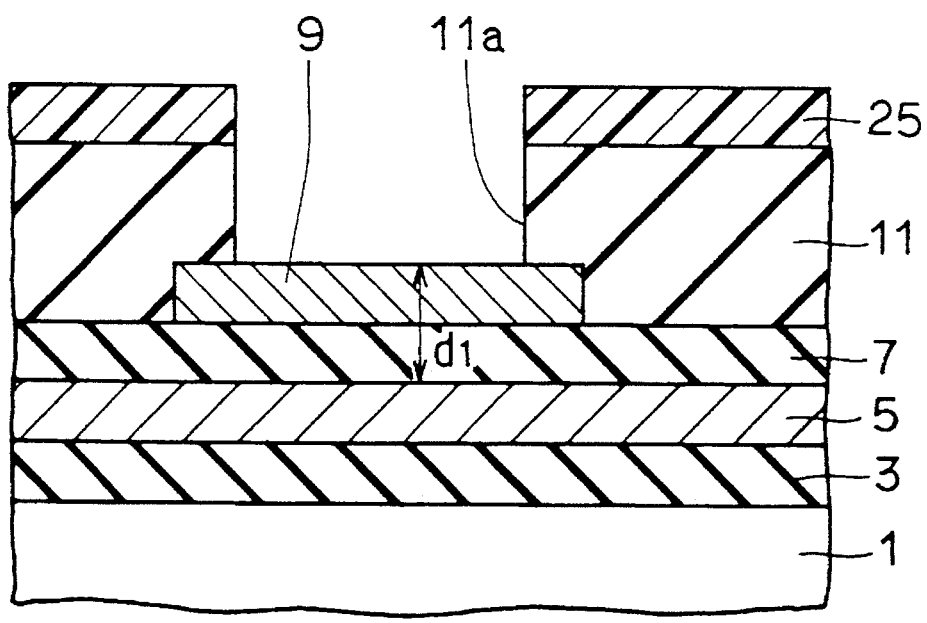

Referring to FIG. 4, this etching forms hole 11a at the position in insulating layer 11 immediately above connection conductive layer 5 such that the surface of silicon nitride film 9 is partially exposed through the same. Thereafter, photoresist 25 is removed, and thereby the semiconductor device shown in FIG. 1A is completed.

Operation of laser blow for the semiconductor device of this embodiment will be described below.

Figure 5:
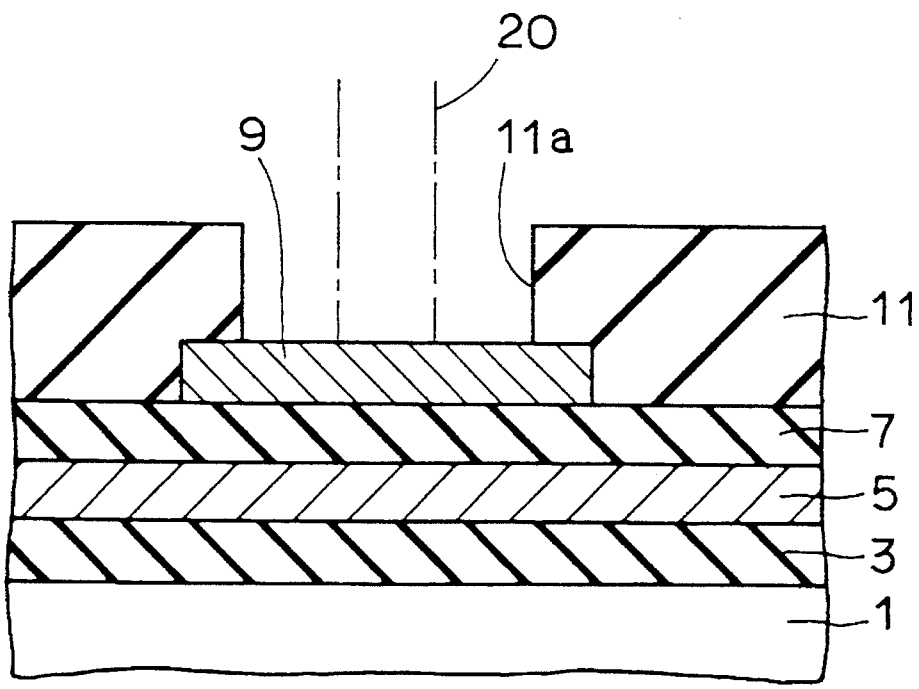
FIGS. 5 and 6 are schematic cross sections showing fuse blow operation in the semiconductor device of the first embodiment of the invention in accordance with the order of steps.

Referring to FIG. 5, a laser beam 20 is radiated through hole 11a to silicon nitride film 9 located immediately above connection conductive layer 5. Laser beam 20 passes through silicon nitride film 9 and insulating layer 7 and reaches connection conductive layer 5. Thereby, a pressure increases at the vicinity of connection conductive layer 5, so that insulating layer 7 and silicon nitride film 9 located above connection conductive layer 5 are blown off.

Figure 6:
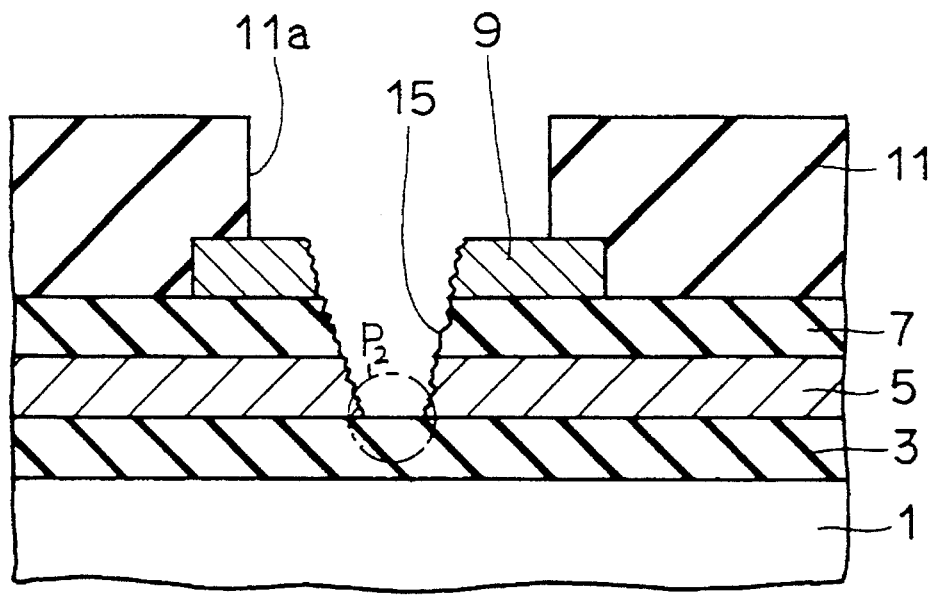

Referring to FIG. 6, a crater 15 is formed as a result of blow-off of silicon nitride film 9 and insulating layer 7. Thereby, connection conductive layer 5 is cut.

In the method of manufacturing the semiconductor device of this embodiment, silicon nitride film 9 and silicon oxide film 11 are formed in a layered fashion on connection conductive layer 5 as shown in FIG. 2. Owing to the layered structure of silicon nitride film 9 and silicon oxide film 11, the etching select ratio of 3 or more can be ensured between these two layers 9 and 11 by appropriately selecting the etching conditions. Therefore, even if silicon oxide film 11 is etched up to an extent that the surface of silicon nitride film 9 is exposed at the process shown in FIG. 4, silicon nitride film 9 is hardly removed by this etching. Therefore, by setting a total film thickness $d_1$ of layered silicon nitride film 9 and insulating layer 7 to an intended value of, e.g., 5000Å, the film thickness of the insulating layers (insulating layer 7 and silicon nitride film 9) on connection conductive layer 5 can be controlled easily. Thereby, the film thickness suitable to the laser blow can be obtained, so that the embodiment can provide the semiconductor device in which high reliability in electrical connection is ensured and replacement with the redundant circuit can be correctly performed.

Figure 7:
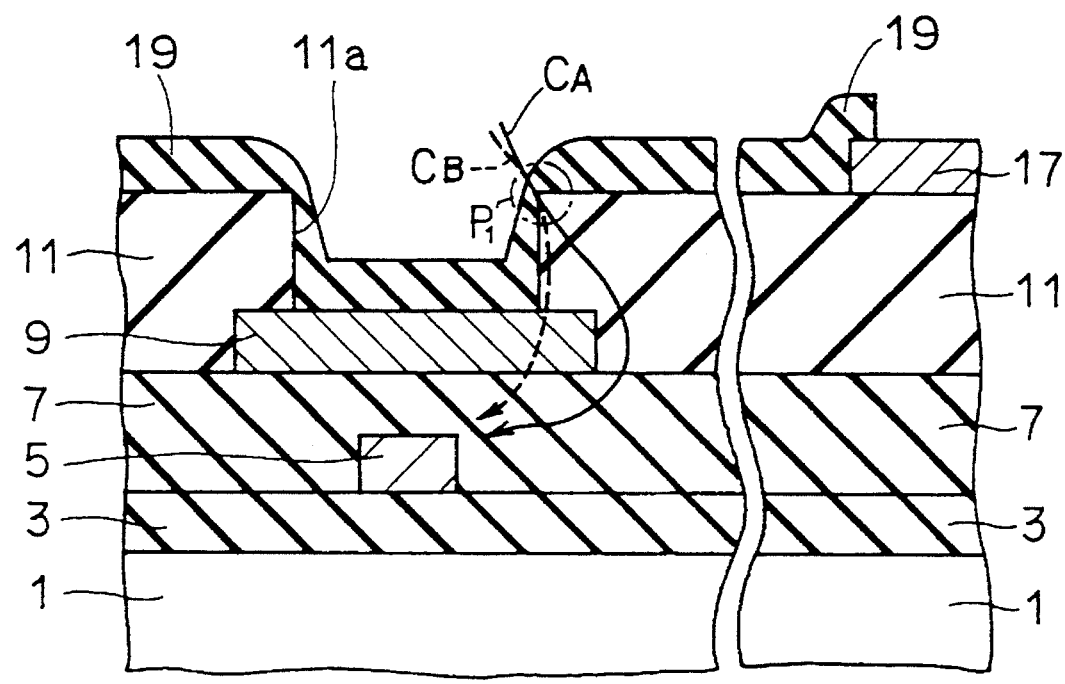
FIG. 7 is a schematic cross section showing distinctive operation and effect of the first embodiment of the invention.

As shown in FIG. 7, a passivation film 19 is formed at the uppermost level without covering an electrode layer 17 forming a pad portion. Passivation film 19 is generally made of material resistive to moisture, and serves to prevent entry of moisture into elements.

However, if hole 11a is formed above the connection conductive layer as is done in this embodiment, a film thickness of passivation film 19 is reduced at a corner $P_1$ of hole 11a. Therefore, moisture is prone to enter through corner $P_1$.

If moisture entered and reached connection conductive layer 5, connection conductive layer 5 would corrode, causing a disadvantage such as breakage in some cases.

In the semiconductor device of this embodiment, insulating layer 7 and silicon nitride film 9 are layered on connection conductive layer 5. Silicon nitride film 9 is more resistive to moisture than the silicon oxide film and others. Therefore, moisture hardly reaches connection conductive layer 5 through a path $C_B$ extending in silicon nitride film 9. Accordingly, moisture can substantially flow toward connection conductive layer 5 only through a path $C_A$ avoiding silicon nitride film 9. Thus, owing to provision of silicon nitride film 9, moisture flowing toward connection conductive layer 5 must flow around silicon nitride film 9. Therefore, moisture must flow through a long path before it reaches connection conductive layer 5, so that moisture is suppressed from reaching connection conductive layer 5. Accordingly, it is possible to prevent corrosion of connection conductive layer 5 resulting in breakage and other disadvantages which may be caused by moisture and others.

If silicon nitride film 9 were not provided, moisture would be prone to enter. Therefore, portions of cut connection conductive layer 5 would be short-circuited by the entered moisture in some cases.

In this embodiment, however, moisture is suppressed from reaching connection conductive layer 5 owing to provision of silicon nitride film 9 as already described. Therefore, as shown in FIG. 6, moisture is hardly accumulated at a cut portion $P_2$, and it is possible to prevent the short-circuit between the portions of cut connection conductive layer 5 by moisture.

In this embodiment, as shown in FIG. 5, laser beam 20 is radiated to silicon nitride film 9. Silicon nitride film 9 has a reflectance of 30% with respect to a wave length in an infrared band used in a laser, if its film thickness is 1000Å or more. Meanwhile, a reflectance of the silicon oxide film changes periodically depending on a film thickness or depth to the fuse forming the base. Therefore, it is not easy to set the reflectance of the silicon oxide film to an intended value. Since the reflectance of polycrystalline silicon is about 60% and higher than the reflectance of silicon nitride film. Such a high reflectance suppresses passage of laser beam 20 toward connection conductive layer 5, resulting in increase of energy consumption.

As described above, this embodiment is provided with silicon nitride film 9, and laser beam 20 is radiated to silicon nitride film 9, so that the reflectance can be controlled well and the energy consumption can be reduced.

Embodiment 2

Figure 8:
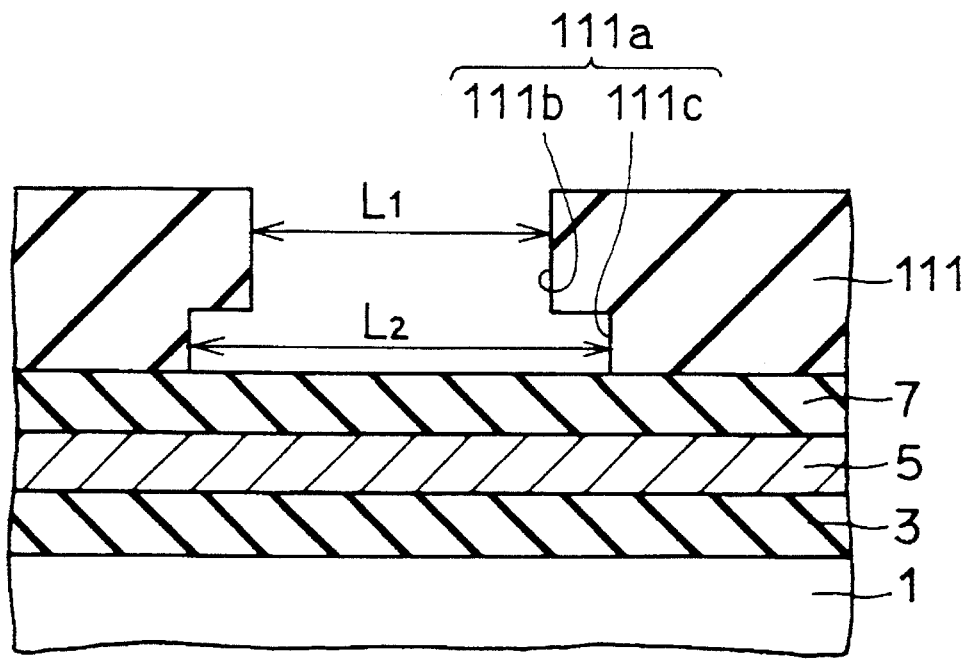
FIG. 8 is a cross section schematically showing a structure of a semiconductor device of a second embodiment of the invention.

Referring to FIG. 8, insulating layer 3 is formed on the surface of p-type semiconductor substrate 1. Patterned connection conductive layer 5 which is made of polycrystalline silicon and will form the fuse elements is formed on the surface of insulating layer 3. Connection control layer 5 is covered with insulating layer 7 made of, e.g., a silicon oxide film is formed. An insulating layer 111 made of, e.g., a silicon oxide film is formed on silicon oxide film 7. Insulating layer 111 is provided with a hole 111a immediately above connection conductive layer 5. Hole 111a is formed of a first hole 111b and a second hole 111c.

First hole 111b is located at and near an upper surface of insulating layer 111, and has a first open diameter of $L_1$. Second hole 111c adjacent to connection conductive layer 5 is in communication with first hole 111b, and has a second diameter $L_2$ larger than first diameter $L_1$.

The surface of insulating layer 7 is partially exposed through hole 111a.

A method of manufacturing the semiconductor device of the embodiment will be described below.

Figure 9:
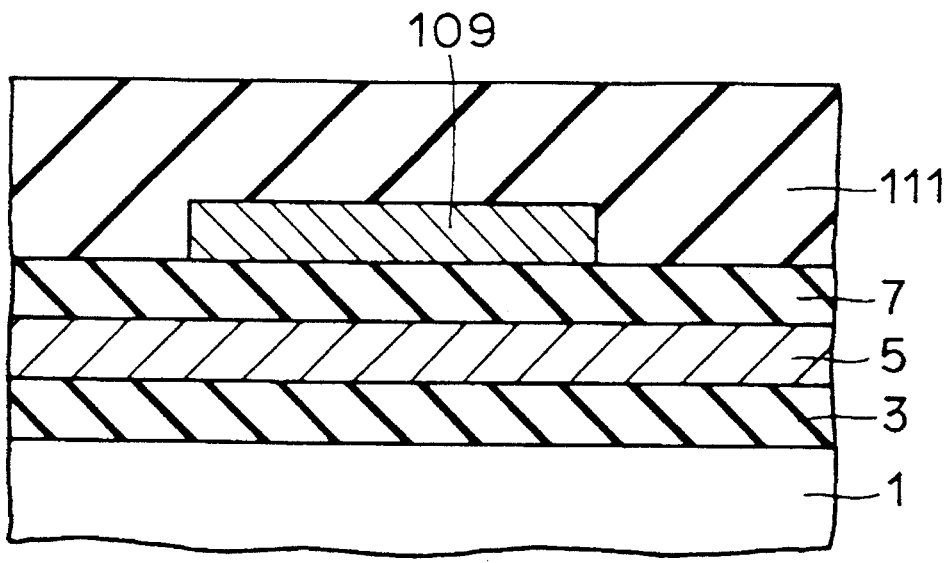
FIGS. 9–12 are schematic cross sections showing a method of manufacturing the semiconductor device of the second embodiment of the invention in accordance with the order of steps.

Referring to FIG. 9, insulating layer 3 made of, e.g., the element isolating oxide film is formed on the surface of p-type silicon substrate 1. Connection conductive layer 5 made of, e.g., polycrystalline silicon is formed on insulating layer 3 by patterning it into the intended configuration. Insulating layer 7 made of, e.g., the silicon oxide film is formed over the connection conductive layer 5 by the CVD method. A conductive layer 109 is formed from material having appropriate etching characteristics, i.e., characteristics according to which conductive layer 109 is etched, by patterning it into an intended configuration. The aforementioned etching characteristics of conductive layer 109 are different from those of insulating layer 7. An insulating layer 111 made of, e.g., a silicon oxide film having etching characteristics different from those of conductive layer 109 is formed over conductive layer 109.

Figure 10:
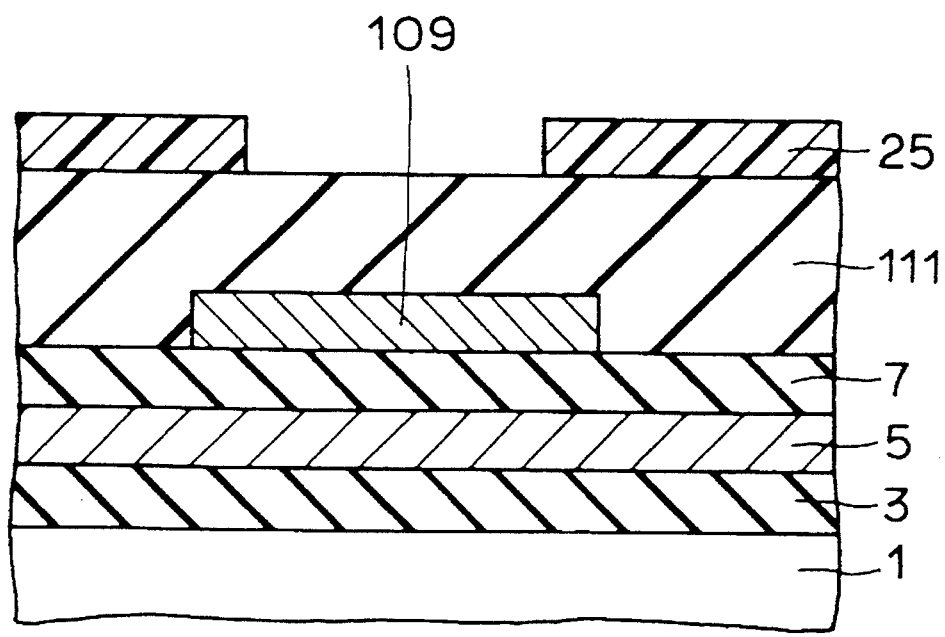

Referring to FIG. 10, a resist pattern 25 having an intended configuration is formed on the surface of insulating layer 111. Using resist pattern 25 as a mask, anisotropic etching is effected on insulating layer 111 to expose the surface of conductive layer 109.

Figure 11:
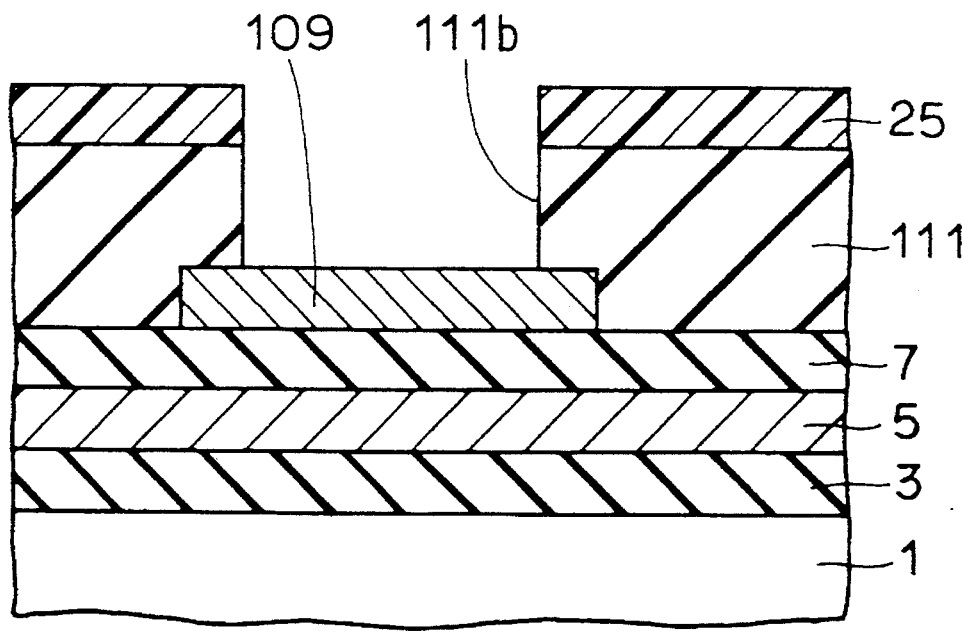

Referring to FIG. 11, this etching forms at insulating layer 111 hole 111b which exposes a portion of the surface of conductive layer 109 and is located immediately above connection conductive layer 5. Thereafter, isotropic etching is effected on conductive layer 109 through hole 111b.

Figure 12:
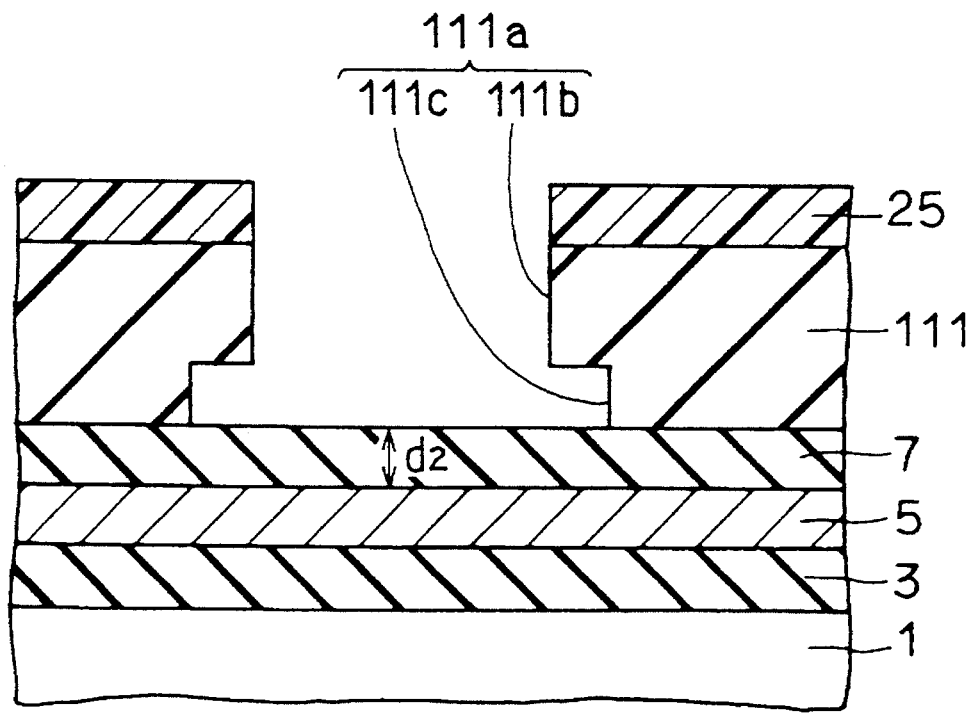

Referring to FIG. 12, this isotropic etching entirely removes patterned conductive layer 109. In connection with this, conductive layer 109 is made of material of which etching characteristics are different from those of insulating layers 7 and 111. Therefore, by ensuring a large etching ratio between conductive layer 109 and insulating layers 7 and 111, insulating layers 7 and 111 are prevented from being removed by the etching effected on conductive layer 109. Therefore, the thickness of insulating layer 7 is hardly reduced by the etching effected on conductive layer 110. Thereafter, resist pattern 25 is removed, and the semiconductor device of the embodiment shown in FIG. 8 is completed.

Operation of fuse blow in this embodiment will be described below.

Figure 13:
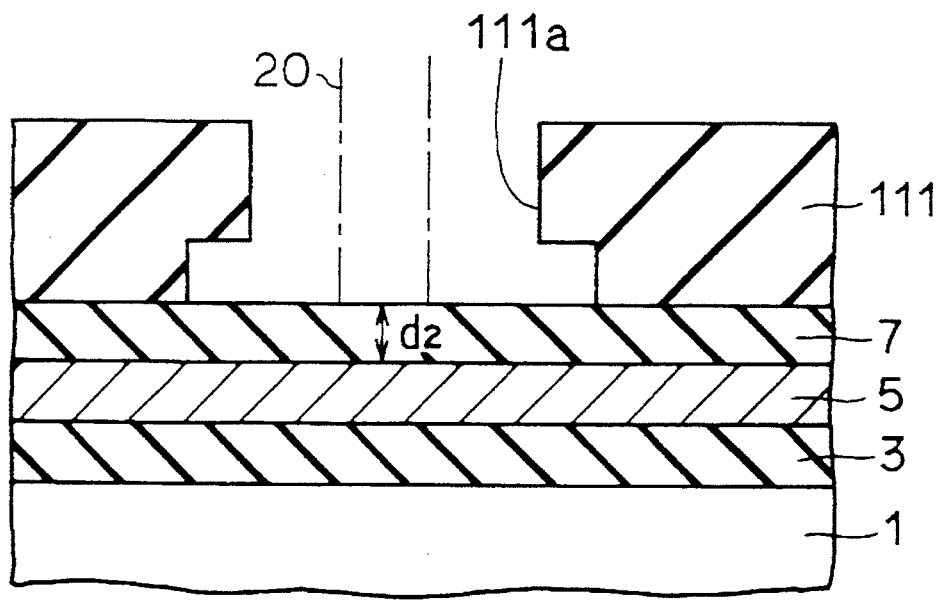
FIGS. 13 and 14 are schematic cross sections showing fuse blow operation in the semiconductor device of the second embodiment of the invention in accordance with the order of steps.

Referring first to FIG. 13, laser beam 20 is radiated through hole 111a to insulating layer 7 located immediately above connection conductive layer 5. Laser beam 20 passes through insulating layer 7 and reaches connection conductive layer 5. Thereby, the pressure increases at the vicinity of connection conductive layer 5 to blow off insulating layer 7.

Figure 14:
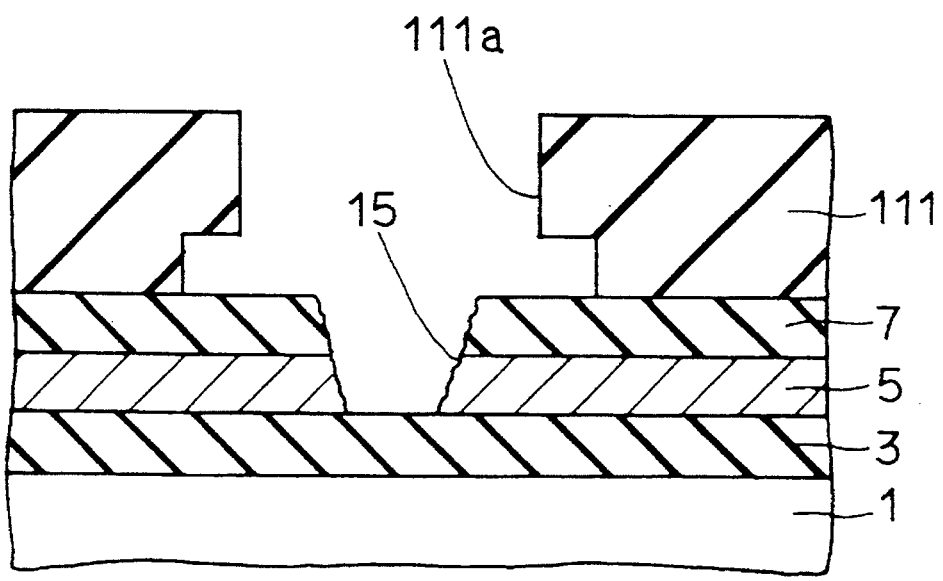

Referring to FIG. 14, a crater 15 is formed by blowing of insulating layer 7 as described above. Also, connection conductive layer 5 is cut.

In the method of manufacturing the semiconductor device of this embodiment, insulating layer 7 and conductive layer 109 having different etching characteristics are formed on the connection conductive layer in a layered fashion. Therefore, insulating layer 7 is hardly etched when etching and removing the conductive layer 109, similarly to the first embodiment. Therefore, by setting a film thickness $d_2$ of insulating layer 7 to an intended value, the film thickness $d_2$ of the insulating layer on the connection conductive layer can be easily controlled, for example, to be 5000Å. Thereby, the film thickness suitable to the fuse blow can be obtained, so that the embodiment can provide the semiconductor device in which high reliability in electrical connection is ensured and replacement with the redundant circuit can be correctly performed.

In this embodiment, conductive layer 109 is entirely removed by the isotropic etching effected through hole 111b at the process shown in FIGS. 11 and 12.

In the process shown in FIG. 11, if anisotropic etching were effected on conductive layer 109 through hole 111b, the following disadvantage would be caused.

Figure 15:
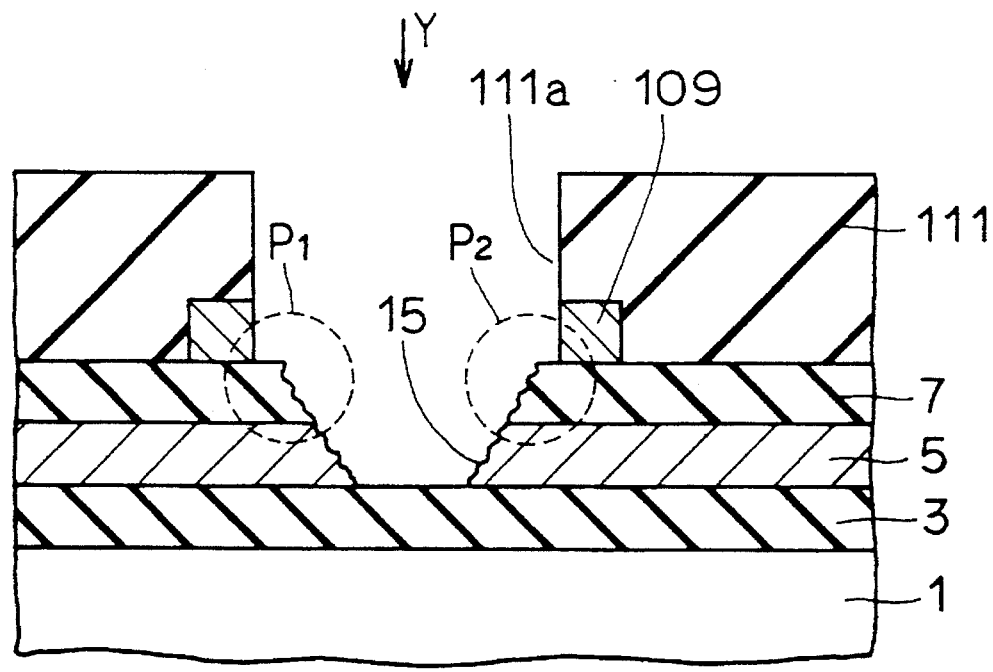
FIG. 15 is a schematic cross section showing a disadvantage caused by anisotropic etching of a conductive layer in the semiconductor device of the second embodiment of the invention.

Referring to FIG. 15, if anisotropic etching is effected on conductive layer 109, a portion of conductive layer 109 remains to define the side wall of hole 111a. Conductive layer 109 is exposed at the side wall of hole 111a. In this state, if connection conductive layer 5 is cut, residue of cut connection conductive layer 5 may adhere to regions $P_1$ and $P_2$ between connection conductive layer 5 and conductive layer 109.

Figure 16:
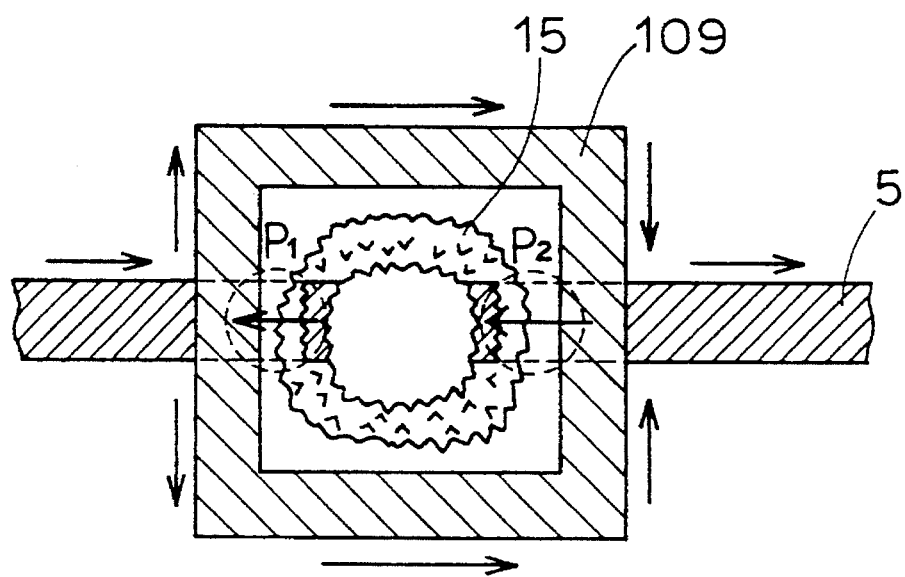
FIG. 16 is a schematic plan viewed in a direction of an arrow Y in FIG. 15.

Referring to FIG. 16, if the residue of connection conductive layer 5 adhered to both regions $P_1$ and $P_2$, the residue makes connection between the cut connection conductive layer 5 and the remaining connection conductive layer 109. Thereby, cut connection conductive layer 5 is electrically connected, i.e., short-circuited to remaining conductive layer 109.

As described above, if conductive layer 109 used as the etching stopper were not entirely removed, portions of cut connection conductive layer 5 would be electrically connected together in spite of the fact that connection conductive layer 5 forming the fuse had been cut.

Meanwhile, according to the method of manufacturing the semiconductor device of this embodiment, conductive layer 109 which was used as the etching stopper is completely removed by the wet etching. Therefore, the remaining conductive layer 109 does not electrically short-circuit the portions of cut connection conductive layer 5.

Figure 17:
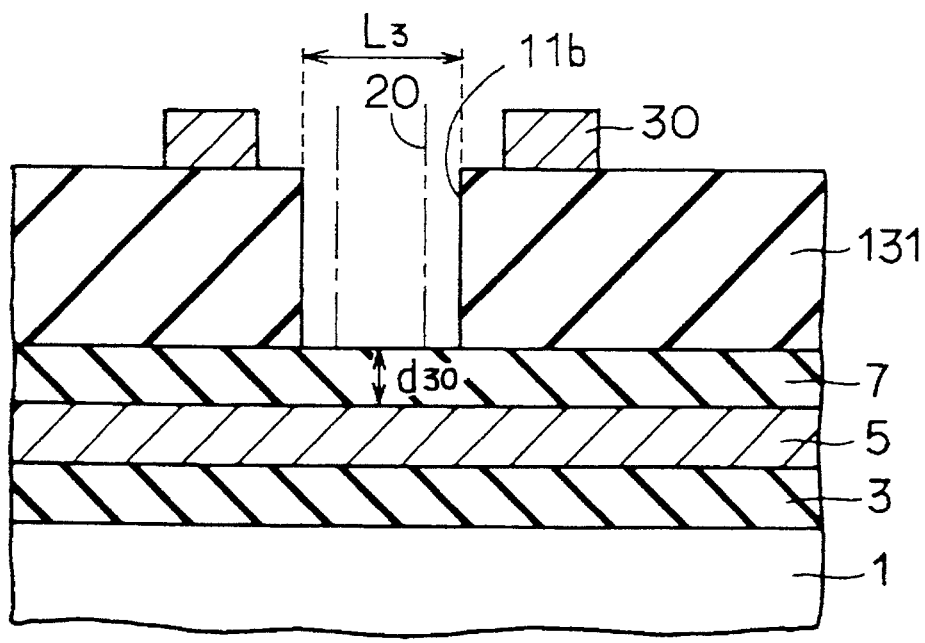
FIGS. 17 and 18 are schematic cross sections showing a disadvantage caused by a hole having a uniform diameter through its entire depth.
Figure 18:
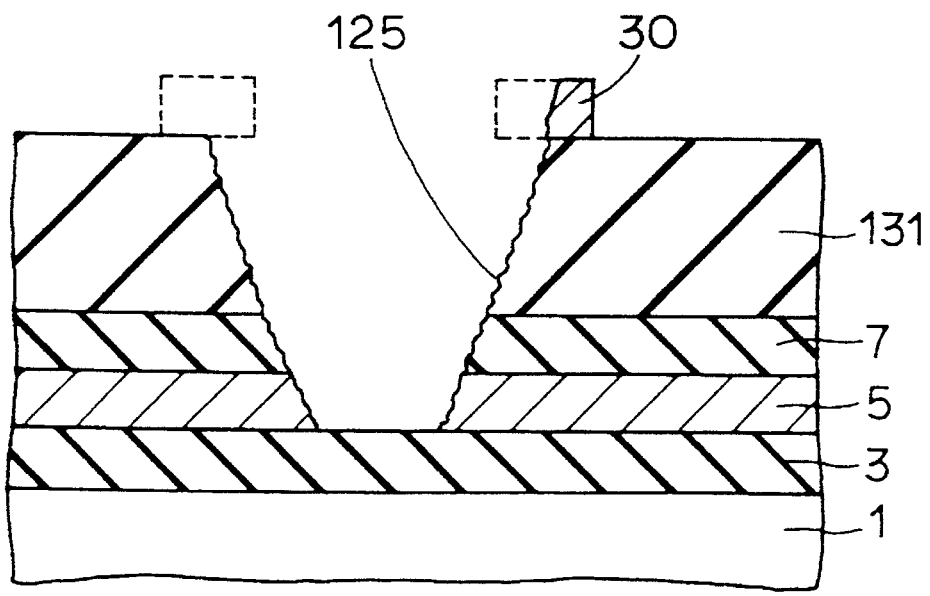

Referring to FIG. 17, if the open diameter of hole 11b is substantially constant through its entire depth as is done in the prior art, a crater 125 formed by the cut of connection conductive layer 5 may extend beyond a range of the bottom of hole 11b in such a case that hole 11b is designed to have a small diameter $L_3$ in accordance with increase of the degree of integration. Thus, crater 125 may extend up to the upper surface of insulating layer 131 as shown in FIG. 18. Generally, a plurality of aluminum interconnection layers 30 are formed on insulating layer 131. Therefore, crater 125 extended to the upper surface of insulating layer 131 may damage or break aluminum interconnection layer(s) 30.

Figure 19:
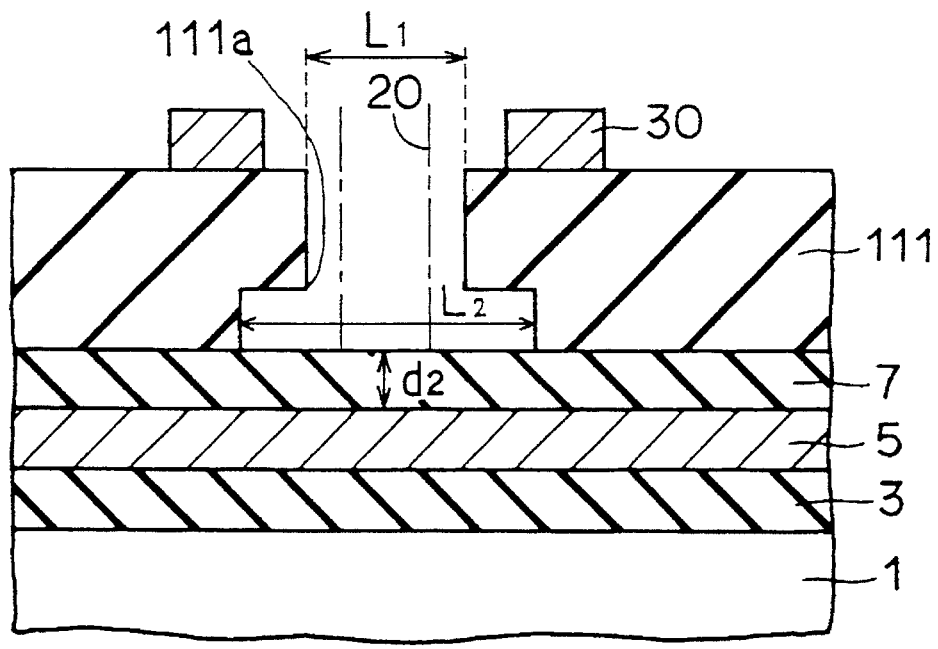
FIGS. 19 and 20 are schematic cross sections showing an effect of the semiconductor device of the second embodiment of the invention.
Figure 20:
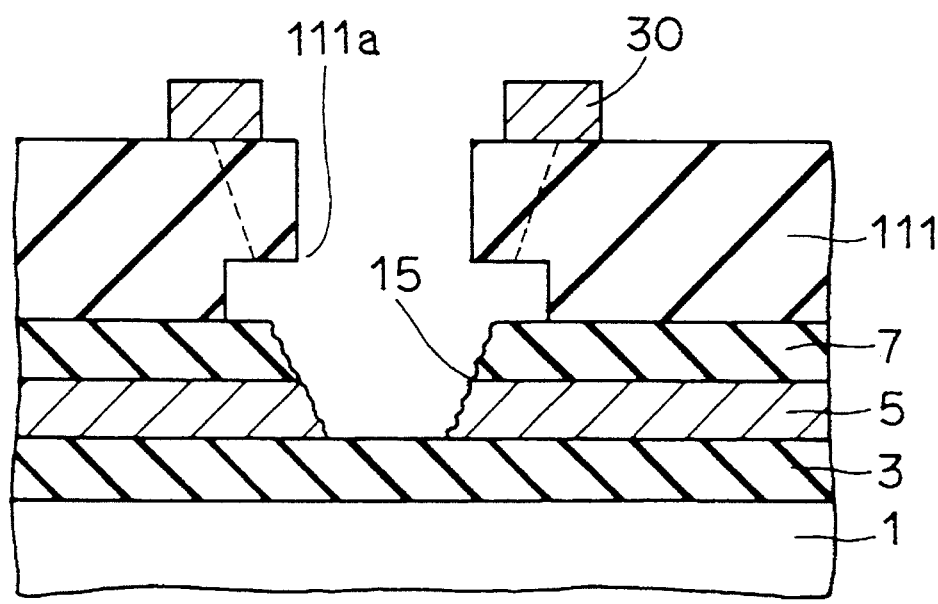

Meanwhile, in this embodiment, hole 111a is formed of first hole 111b and second hole 111c as shown in FIG. 19. Second hole 111c has open diameter $L_2$ larger than open diameter $L_1$ of first hole 111b. Therefore, even if first hole 111b is designed to have small open diameter $L_1$ for high integration, second hole 111c can be designed to have the open diameter allowing the open end of crater 15 to be located within a range of the bottom of second hole 111c as shown in FIG. 20. Accordingly, crater 15 does not reach the upper surface of insulating layer 111, and thus aluminum interconnection layer 30 can be prevented from damage and breakage.

In this embodiment, anisotropic etching may be effected on insulating layer 7 without removing resist pattern 25 after the process shown in FIG. 12. In this case, a state shown in FIG. 21 is obtained after the etching.

Figure 21:
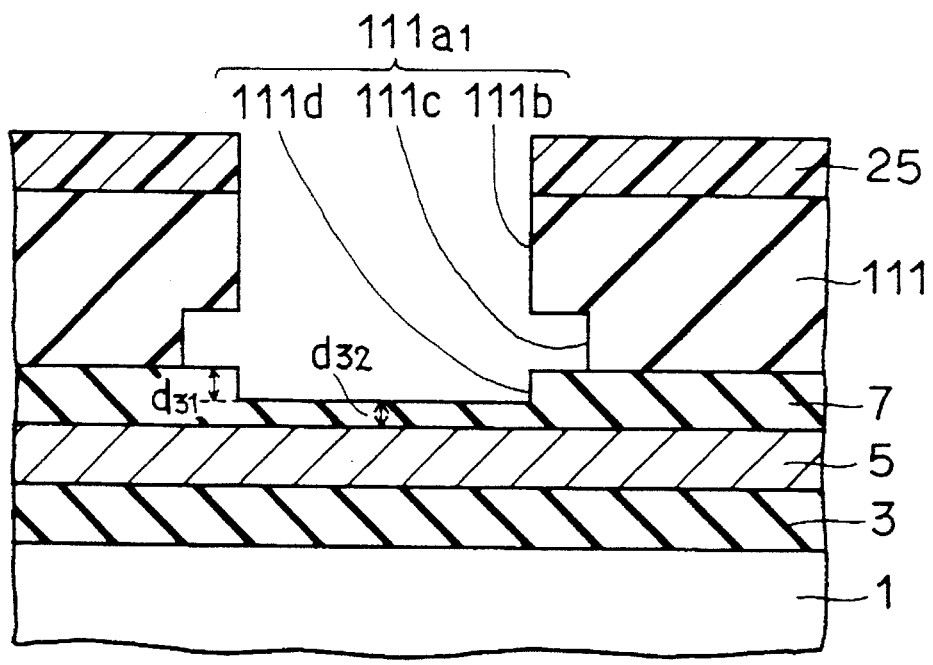
FIG. 21 is a schematic cross section showing a post-step of a semiconductor device of the second embodiment of the invention.

In this case, an etched amount $d_{31}$ of insulating layer 7 is very small as shown in FIG. 21. Therefore, fluctuation caused by the etching is very small. Therefore, a film thickness $d_{32}$ of insulating layer 7 on connection conductive layer 5 can be set to an intended value with good controllability.

Figure 22:
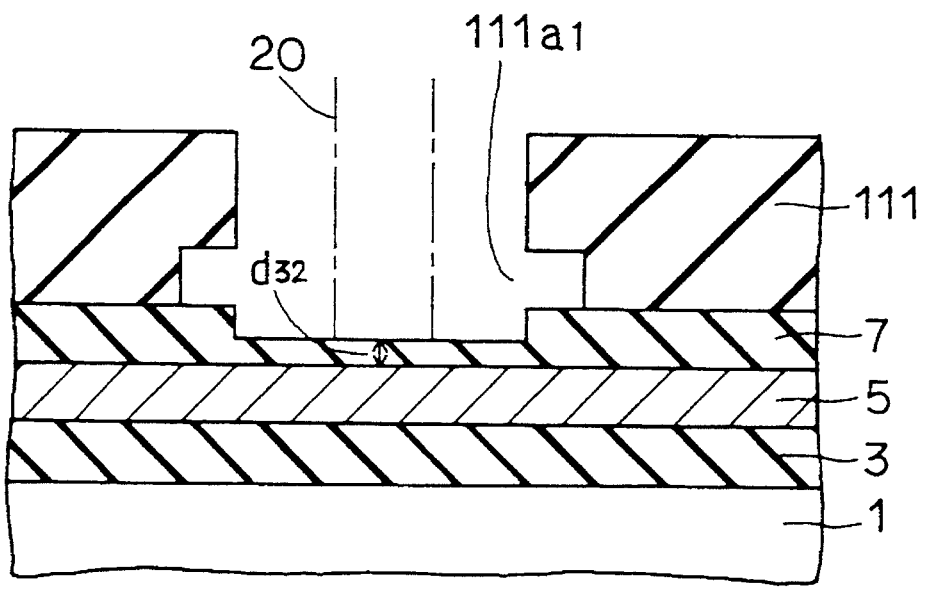
FIGS. 22 and 23 are schematic cross sections showing fuse blow operation in the semiconductor device shown in FIG. 21 in accordance with the order of steps.

For fuse blow, as shown in FIG. 22, laser beam 20 is radiated to insulating layer 7 located immediately above connection conductive layer 5 through a hole $111a_1$.

Figure 23:
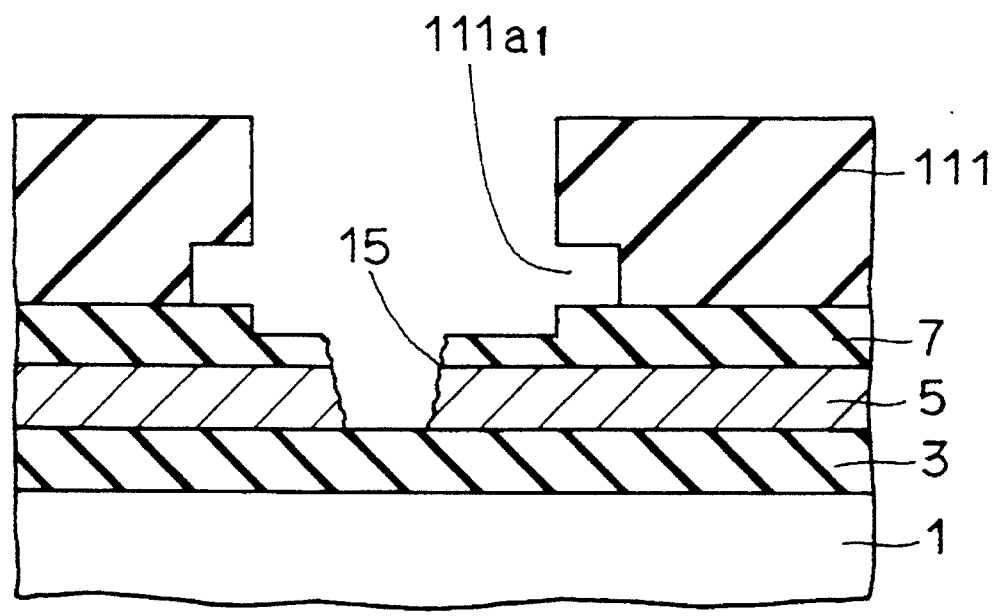

Referring to FIG. 23, insulating layer 7 is blown off and connection conductive layer 5 is vaporized by the radiation of laser, so that crater 15 is formed. In this manner, connection conductive layer is cut.

Embodiment 3

Figure 24:
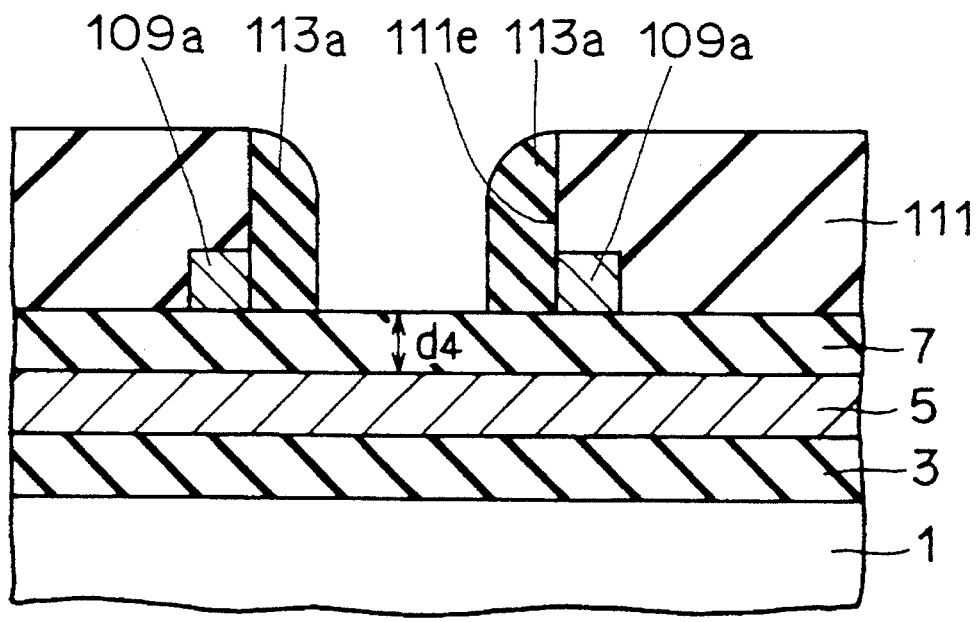
FIG. 24 is a cross section schematically showing a structure of a semiconductor device of a third embodiment of the invention.

Referring to FIG. 24, insulating layer 3 made of, e.g., element isolating oxide film is formed on the surface of p-type silicon substrate 1. Connection conductive layer 5 made of, e.g., polycrystalline silicon is formed on the surface of insulating layer 3. Connection conductive layer 5 is covered with insulating layer 7 made of, e.g., a silicon oxide film. Insulating layer 111 made of, e.g., a silicon oxide film is formed on the surface of insulating layer 7.

Insulating layer 111 is provided with hole 111e reaching the surface of insulating layer 7. A conductive layer 109a is formed in contact with the upper surface of insulating layer 7. Conductive layer 109a has a surface faced to the side wall of hole 111e and extends around the peripheral surface of hole 111e. A side wall insulating layer 113a made of, e.g., a silicon nitride film is formed on a portion of the surface of insulating layer 7 to cover the surface of conductive layer 109a faced to hole 111e.

A method of manufacturing the semiconductor device of this embodiment will be described below.

The manufacturing method of this embodiment is executed through the same steps as those of the second embodiment shown in FIGS. 9 to 11. Referring to FIG. 11, anisotropic etching is effected on conductive layer 109 through hole 111b to expose the surface of insulating layer 7.

Figure 25:
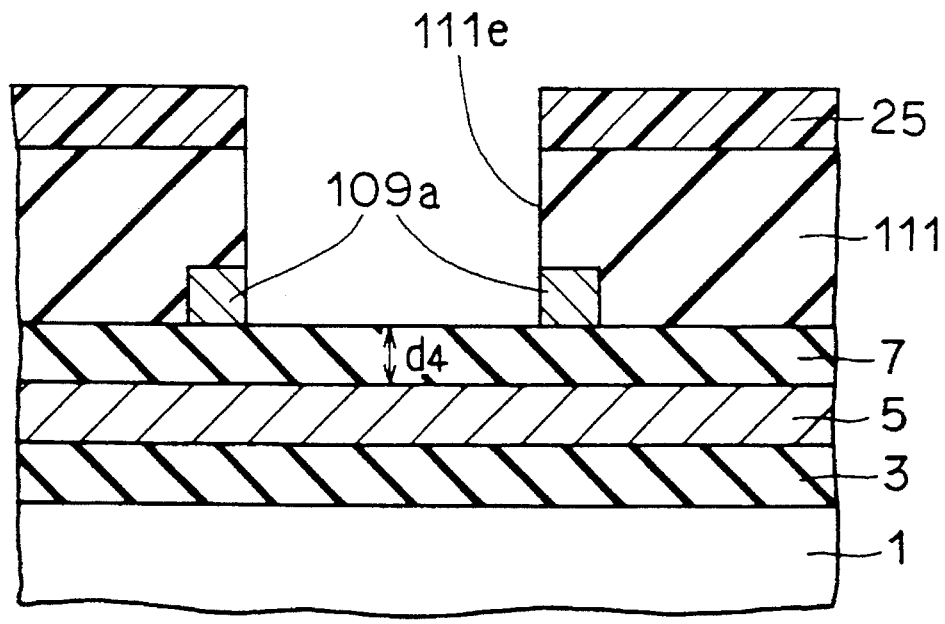
FIGS. 25 and 26 are schematic cross sections showing a method of manufacturing the semiconductor device of the third embodiment of the invention in accordance with the order of steps.

Referring to FIG. 25, this etching forms a hole 111e configured such that the surface of insulating layer 7 is partially exposed at the bottom of hole 111e and the surface of conductive layer 109a is exposed at the lower portion of the side wall of hole 111e. Thereafter, resist pattern 25 is removed.

Figure 26:
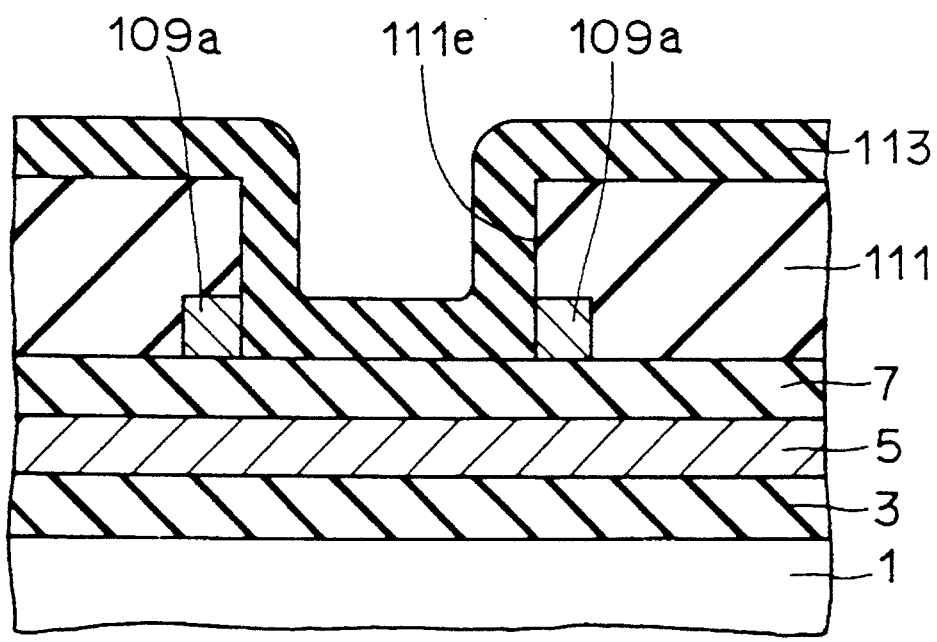

Referring to FIG. 26, an insulating layer 113 made of, e.g., a silicon nitride film is formed by the CVD method to cover the whole inner wall of hole 111e and the whole surface of insulating layer 111. Anisotropic etching is effect on the whole surface of insulating layer 113 to expose the surface of insulating layer 7. Thereby, side wall insulating layer 113a which covers the surface of conductive layer 109a faced to the side wall of hole 111e is formed on a portion of the surface of insulating layer 7 as shown in FIG. 24. In this manner, the semiconductor device of the third embodiment is completed.

Operation of the fuse blow in this embodiment will be described below.

Figure 27:
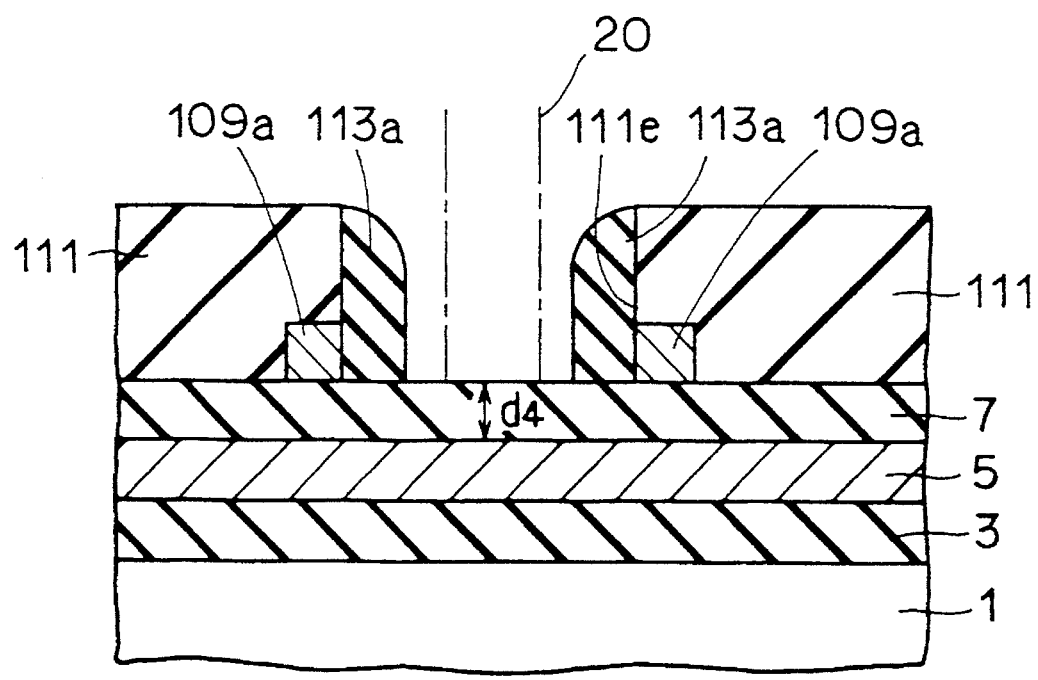
FIGS. 27 and 28 are schematic cross sections showing fuse blow operation in the semiconductor device shown of the third embodiment of the invention in accordance with the order of steps.

Referring to FIG. 27, laser beam 20 is radiated through the hole to the insulating layer 7 located immediately above connection conductive layer 5. Thereby, the pressure increases at the vicinity of connection conductive layer 5 to blow off insulating layer 7.

Figure 28:
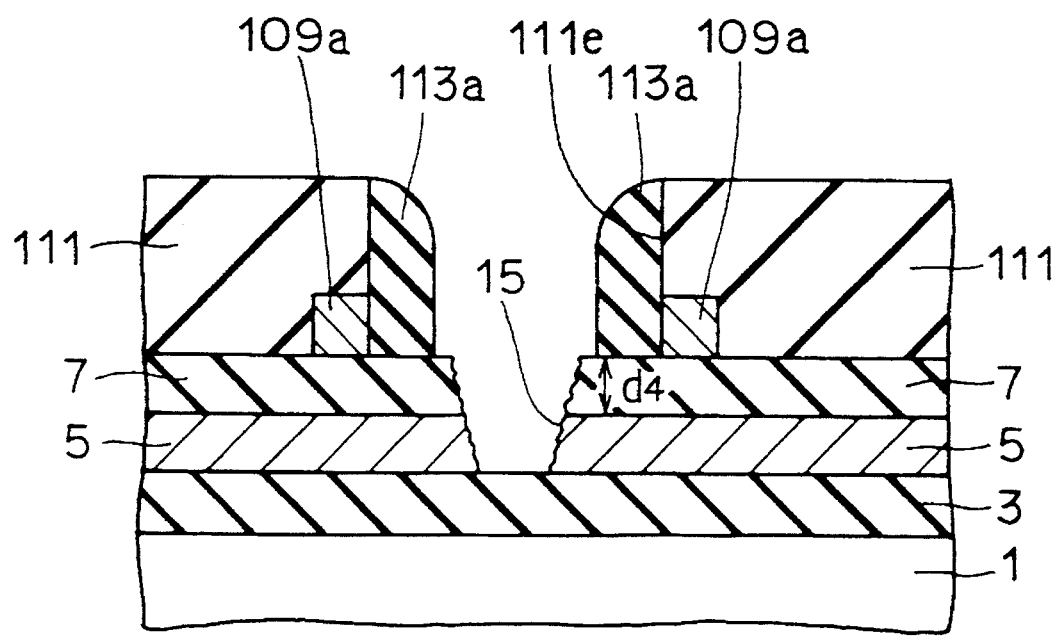

Thereby, connection conductive layer 5 is partially vaporized and insulating layer 7 is blown off, so that crater 15 is formed as shown in FIG. 28. In this manner, connection conductive layer 5 is cut.

According to the method of manufacturing the semiconductor device of this embodiment, insulating layer 7 and connection conductive layer 109 made of different materials having different etching characteristics, according to which they are etched, are formed in a layered fashion on the surface of connection conductive layer 5, similarly to the second embodiment. Therefore, insulating layer 7 is hardly removed by the anisotropic etching effected on conductive layer 109 to expose the surface of insulating layer 7.

Therefore, insulating layer 7 shown in FIG. 24 can maintain the initial film thickness, i.e., the same thickness as that at the time of formation of the same. Therefore, by setting the film thickness to 5000Å, a film thickness $d_4$ of insulating layer 7 on connection conductive layer 5 can be maintained at about 5000Å even after the process of etching conductive layer 109 shown in FIG. 25. Thereby, the film thickness suitable to the fuse blow can be obtained, so that the embodiment can provide the semiconductor device in which reliability in electrical connection is high and replacement with the redundant circuit can be performed correctly.

In the semiconductor device of this embodiment, side wall insulating layer 113a covers the surface of remaining conductive layer 109a. The surface of remaining conductive layer 109a is not exposed when the fuse is blown out. Therefore, similarly to the second embodiment, residue generated by the cut of connection conductive layer 5 does not make electrical connection between connection conductive layer 5 and remaining conductive layer 109a. Accordingly, remaining conductive layer 109a does not short-circuit the portions of cut connection conductive layer 5.

Embodiment 4

Figure 29:
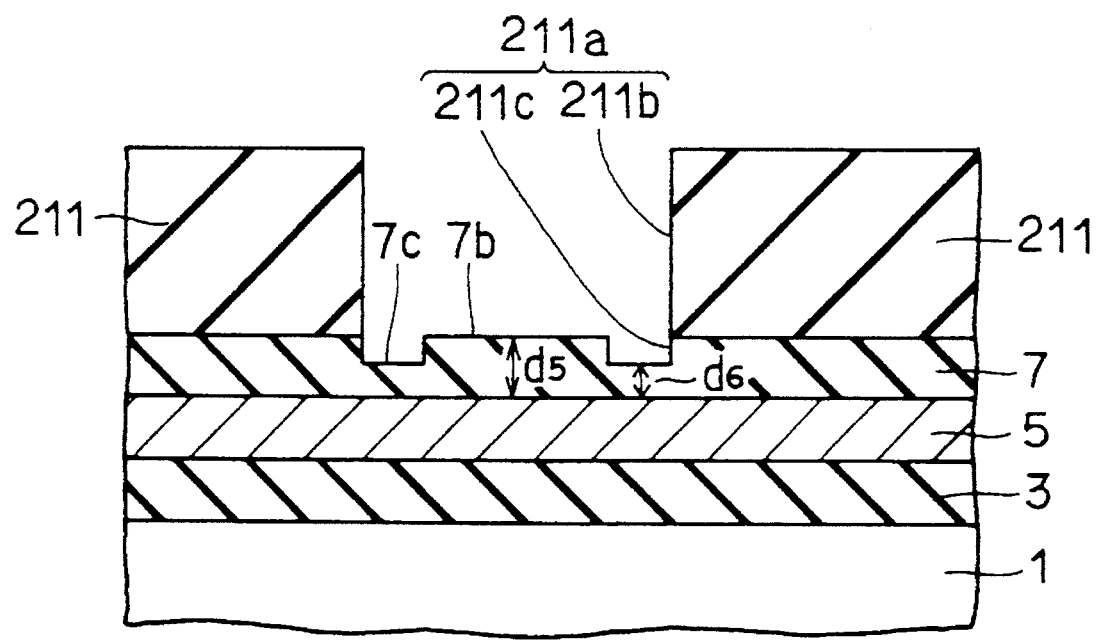
FIG. 29 is a cross section schematically showing a structure of a semiconductor device of a fourth embodiment of the invention.

Referring to FIG. 29, insulating layer 3 made of, e.g., an element isolating oxide film is formed on the surface of p-type silicon substrate 1. Connection conductive layer 5 made of, e.g., polycrystalline silicon is formed by patterning on the surface of insulating layer 3. Insulating layer 7 made of, e.g., a silicon oxide film is formed over connection conductive layer 5. An insulating layer 211 made of, e.g., a silicon oxide film is formed on the surface of insulating layer 7.

A hole 211a exposing a portion of the surface of insulating layer 7 is formed at insulating layer 211. Hole 211a is formed of a first hole 211b and a second hole 211c. First hole 211b is formed at insulating layer 211. Second hole 211c is formed at insulating layer 7. Second hole 211c has the substantially same diameter as first hole 211b and is in communication with the first hole 211b. The surface of insulating layer 7 exposed at the bottom of hole 211a includes a first wall 7b and a second wall 7c. First wall 7b has a first thickness $d_5$. Second wall 7c extends around first wall 7b and has a second thickness $d_6$ smaller than first thickness $d_5$.

A method of manufacturing the semiconductor device of this embodiment will be described below.

Figure 30:
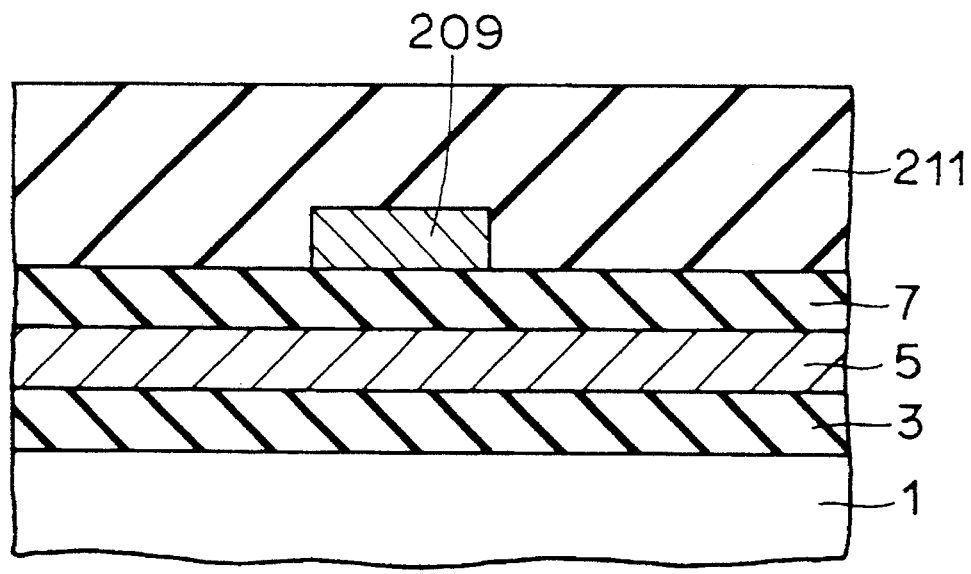
FIGS. 30-33 are schematic cross sections showing a method of manufacturing the semiconductor device of the fourth embodiment of the invention in accordance with the order of steps.

Referring first to FIG. 30, insulating layer 3 made of, e.g., the element isolating oxide film is formed on the surface of semiconductor substrate 1. Connection conductive layer 5 made of, e.g., the polycrystalline silicon is formed by patterning on the surface of insulating layer 3.

Insulating layer 7 made of, e.g., the silicon oxide film is formed to cover the surface of connection conductive layer 5. An etching stopper layer 209 having etching characteristics different from those of insulating layer 7 is formed by patterning on the surface of insulating layer 7. Etching stopper layer 209 is made of, e.g., polycrystalline silicon. Insulating layer 211 made of material such as a silicon oxide film which has etching characteristics different from those of etching stopper layer 209 is formed to cover etching stopper layer 209.

Figure 31:
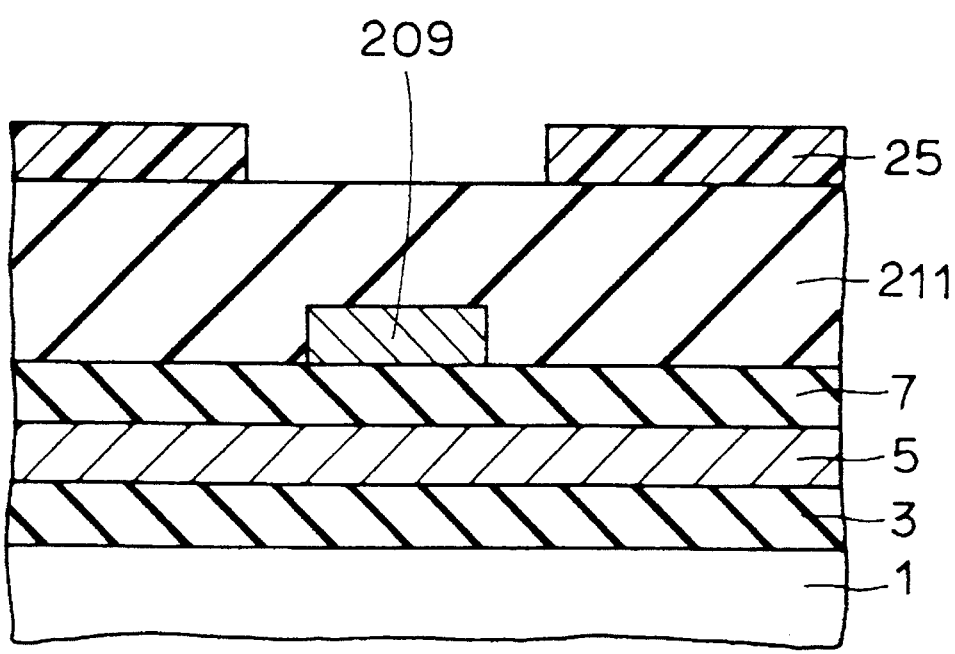

Referring to FIG. 31, resist pattern 25 having an appropriate configuration is formed on the surface of insulating layer 311. Resist pattern 25 has a hole pattern located immediately above a region which is larger than conductive layer 209 and contains conductive layer 209. Using this resist pattern 25 as a mask, anisotropic etching is effected on insulating layers 7 and 211.

Figure 32:
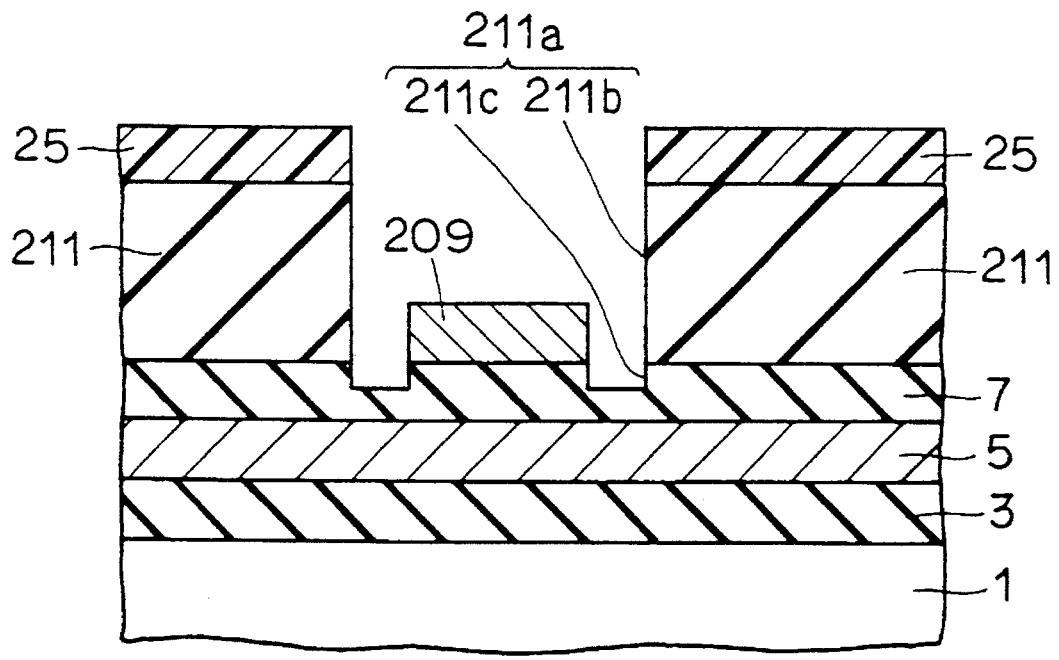
Figure 33:
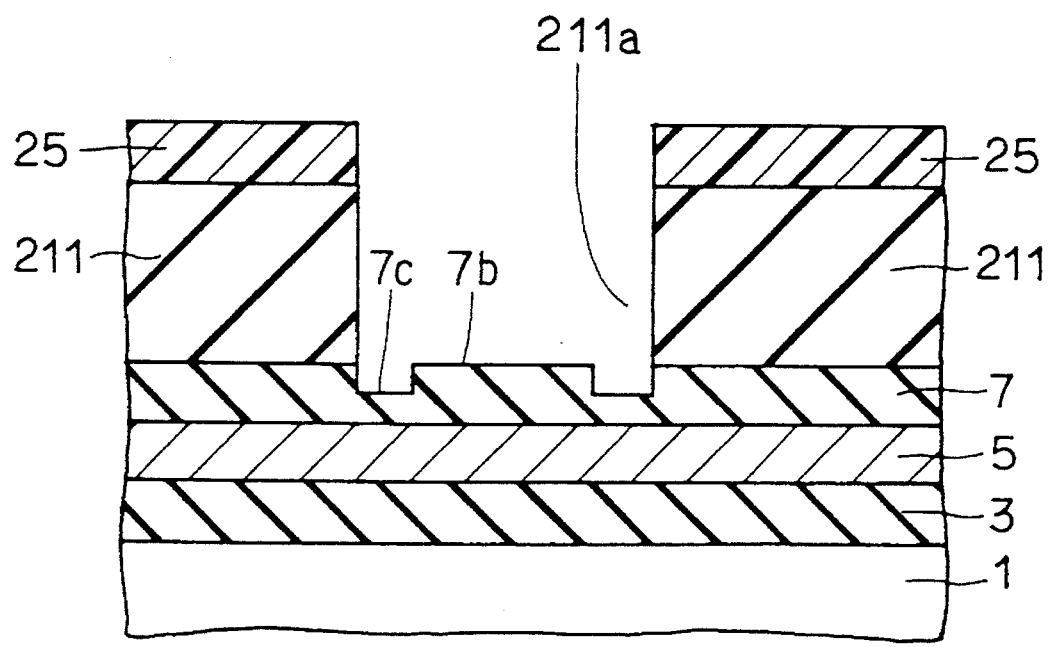

Referring to FIG. 32, this etching is executed as follows. First hole 211b is first formed by etching insulating layer 211 to expose the surface of insulating layer 7. Thereafter, the surface of insulating layer 7 is etched and removed using etching stopper layer 209 as a mask, whereby second hole 211c communicated with first hole 211b is formed. First and second holes 211b and 211c form hole 211a.

In the above etching, since insulating layers 7 and 211 are made of the same material, they are etched and removed at the same etching speed. Meanwhile, etching stopper layer 209 is made of material having the etching characteristics different from those of insulating layers 7 and 211. Therefore, the above etching hardly removes etching stopper layer 209.

Thereafter, etching stopper layer 209 is etched and removed.

As etching stopper layer 209 is removed, a first wall 7b of insulating layer 7 is exposed. Thereafter, resist pattern 25 is removed, and the semiconductor device of this embodiment shown in FIG. 29 is completed.

Operation of fuse blow in this embodiment will be described below.

Figure 34:
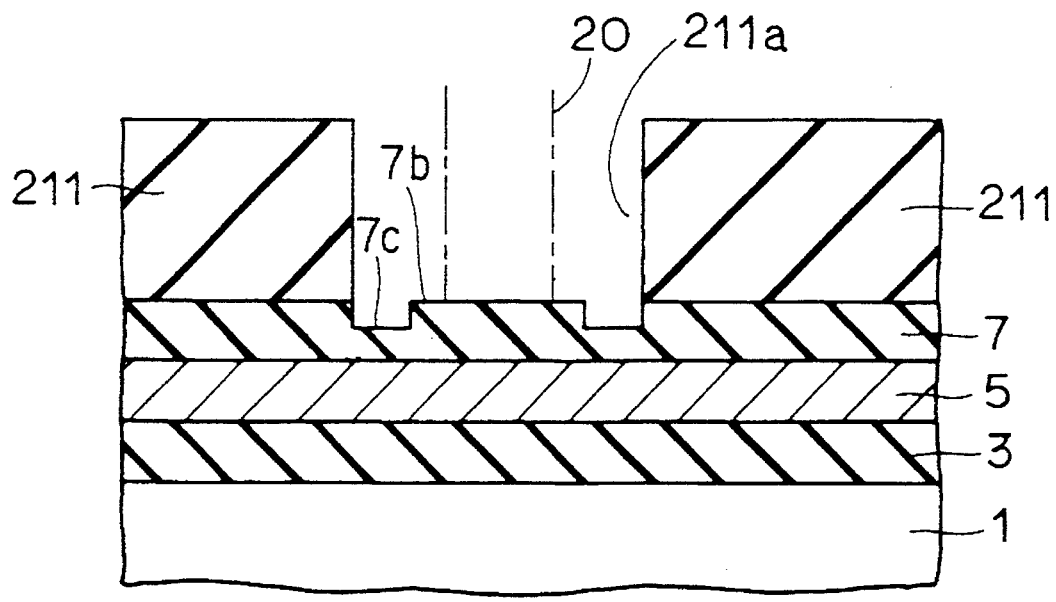
FIGS. 34 and 35 are schematic cross sections showing fuse blow operation in the semiconductor device of the fourth embodiment of the invention in accordance with the order of steps.

Referring first to FIG. 34, laser beam 20 is radiated to first wall 7b through hole 211a. Laser beam 20 passes through insulating layer 7 and reaches connection conductive layer 5. Thereby, the pressure increases at the vicinity of connection conductive layer 5 to blow off insulating layer 7.

Figure 35:
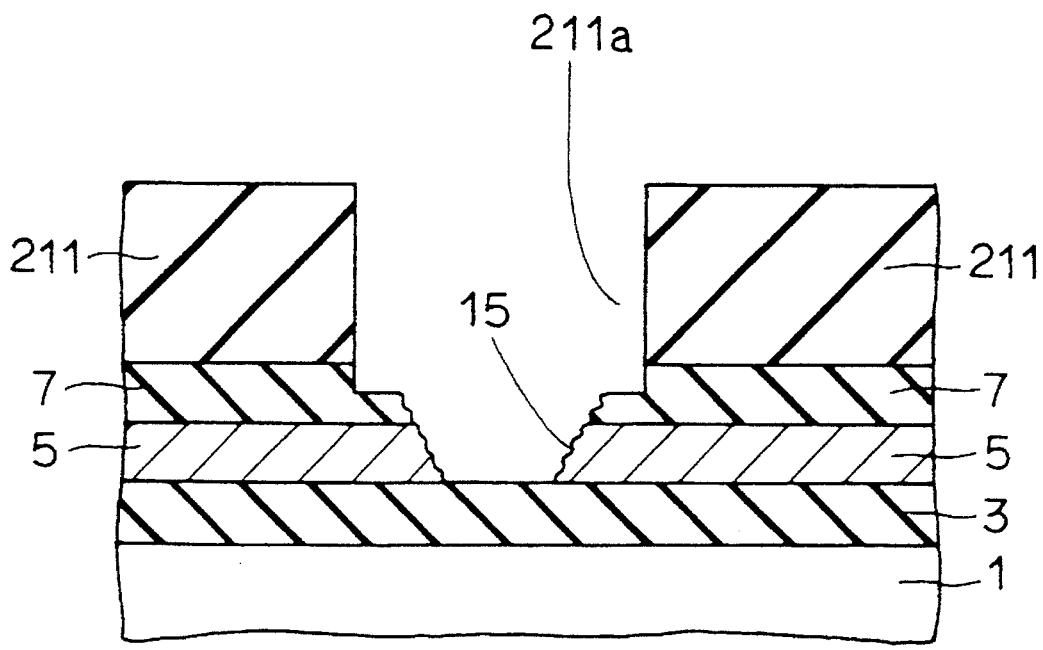

As connection conductive layer 5 is partially vaporized to blow off insulating layer 7, crater 15 is formed as shown in FIG. 35. In this manner, connection conductive layer 5 is cut.

In the method of manufacturing the semiconductor device of this embodiment, insulating layer 7 and etching stopper layer 209 having different etching characteristics are formed in a layered fashion on connection conductive layer 5. Therefore, even if etching stopper layer 209 is etched up to an extent that the surface of insulating layer 7 is exposed, insulating layer 7 is hardly etched and removed. Therefore, by setting the film thickness of insulating layer 7 to 5000Å, film thickness $d_5$ of the insulating layer on the connection conductive layer 5 can be easily maintained at about 5000Å. Thereby, the film thickness suitable to the fuse blow can be obtained, so that the embodiment can provide the semiconductor device in which reliability in electrical connection is high and replacement with the redundant circuit can be performed correctly.

Referring to FIG. 34, if insulating layer 7 on connection conductive layer 5 is thin at the region receiving laser beam 20, the energy of laser beam 20 is lost by the atmosphere. Therefore, energy required for melting connection conductive layer 5 cannot be accumulated sufficiently. Consequently, a large energy is required for cutting connection conductive layer 5, and reduction of energy consumption cannot be achieved.

In view of the accumulation of energy required for the cut, it is preferable that insulating layer 7 on connection conductive layer 5 is thick at the region receiving laser beam 20.

In order to blow off insulating layer 7, a crack must first extend from connection conductive layer 5 to the upper surface of insulating layer 7. However, if insulating layer 7 is thick, the crack must extend a long distance. A large energy is required for forming the long crack, so that a large energy is required if insulating layer 7 is thick.

In view of extension of the crack during the cutting, it is preferable that insulating layer 7 on connection conductive layer 5 is thin.

In the semiconductor device of this embodiment, thick portion (convexity) 7b is provided for receiving laser beam 20, and the convexity is surrounded by thin portion (concavity) 7c. Since the portion (convexity) 7b receiving laser beam 20 is relatively thick, energy loss of laser beam 20 is suppressed. Further, portion (concavity) 7c through which the crack extends during the cutting is relatively thin, so that the crack must extend only a short distance. Therefore, connection conductive layer 5 can be cut with reduced energy.

Embodiment 5

Figure 36A:
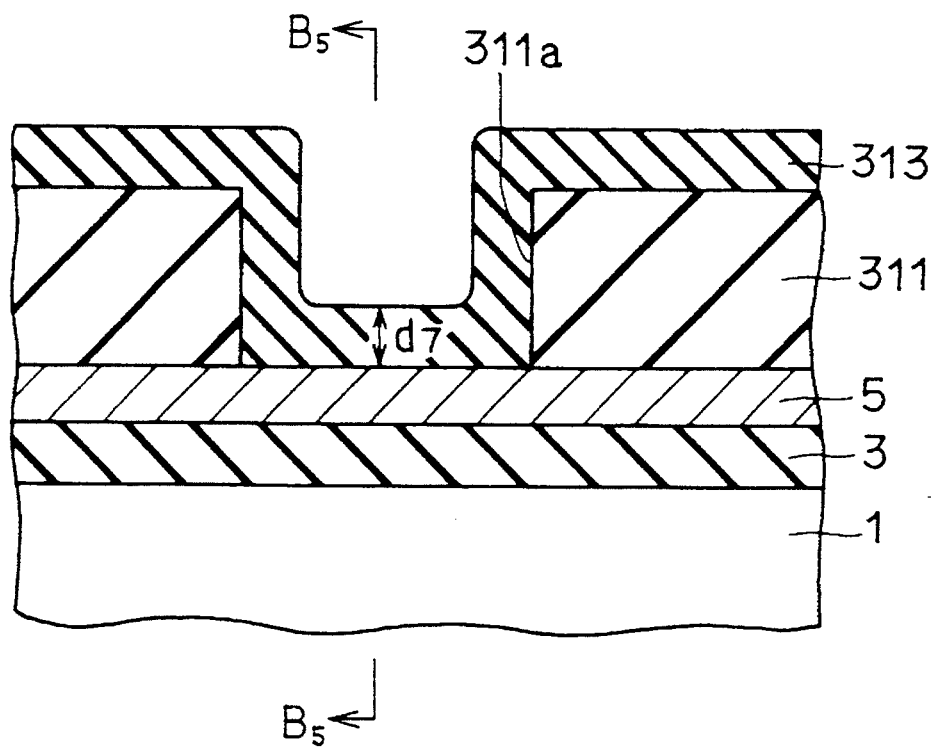
FIGS. 36A and 36B are cross sections schematically showing a structure of a semiconductor device of a fifth embodiment of the invention.
Figure 36B:
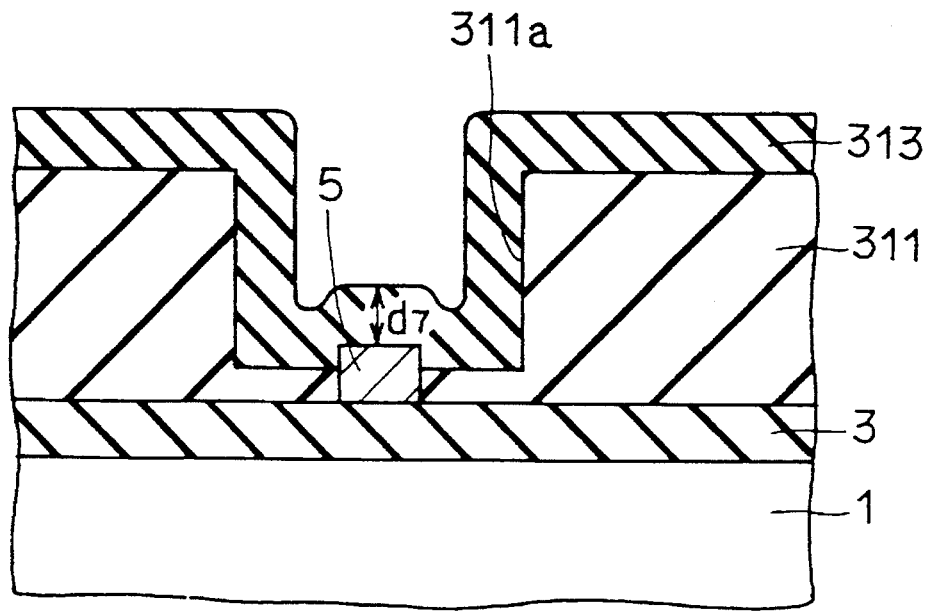

Referring to FIGS. 36A and 36B, insulating layer 3 made of, e.g., the element isolating oxide film is formed on the surface of semiconductor substrate 1. Connection conductive layer 5 made of, e.g., polycrystalline silicon is formed by patterning on the surface of insulating layer 3. An insulating layer 311 made of, e.g., a silicon oxide film is formed on connection conductive layer 5. Insulating layer 311 is provided with a hole 311a.

At the bottom of hole 311a, the upper surface and a portion of the side surface of connection conductive layer 5 are exposed. Connection conductive layer 5 protruded at the bottom of hole 311a is covered with an insulating layer 313 of about 5000Å in thickness, which is made of, e.g., silicon oxide film and is formed on the inner wall of hole 311a and the whole surface of insulating layer 311.

Then, a method of manufacturing the semiconductor device of this embodiment will be described below.

Figure 37A:
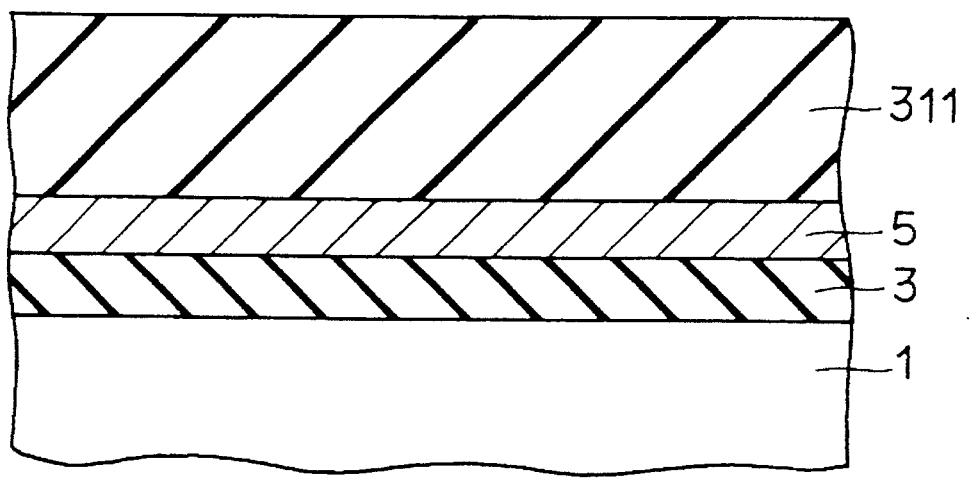
FIGS. 37A and 38A are schematic cross sections corresponding to the cross section of FIG. 36A and showing a method of manufacturing the semiconductor device of the fifth embodiment of the invention in accordance with the order of steps.
Figure 37B:
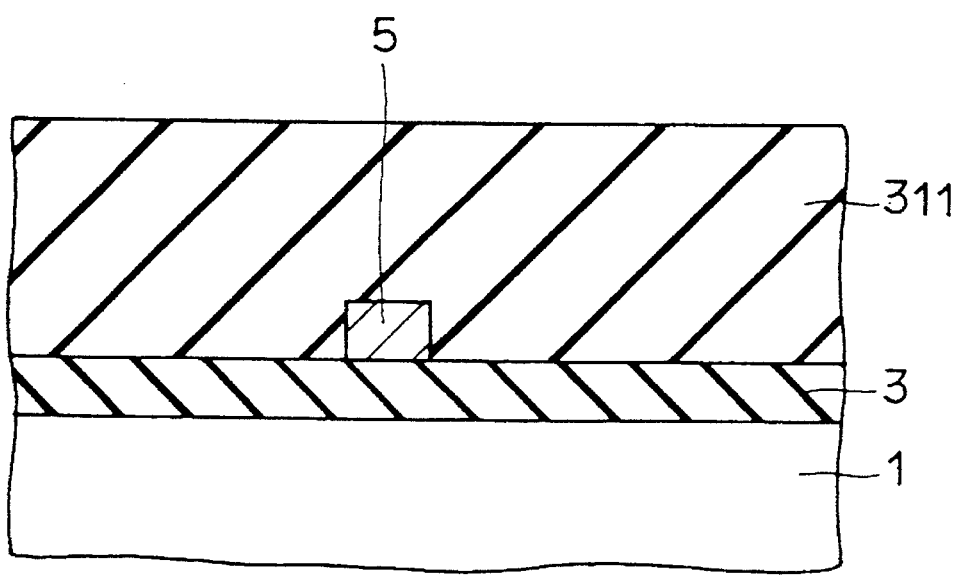
FIGS. 37B and 38B are schematic cross sections corresponding to the cross section of FIG. 36B and showing the method of manufacturing the semiconductor device of the fifth embodiment of the invention in accordance with the order of steps.
Figure 38A:
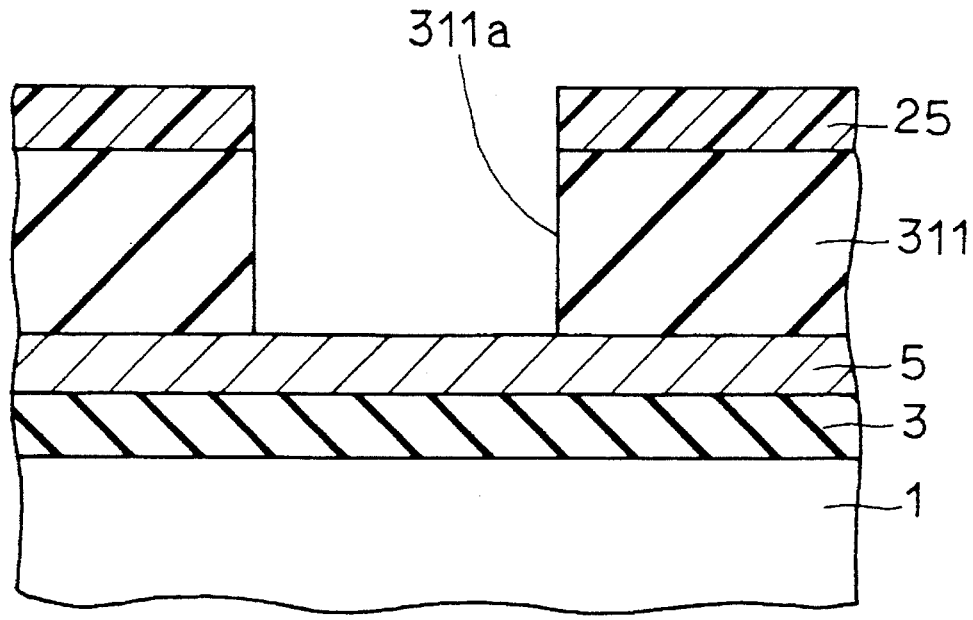
Figure 38B:
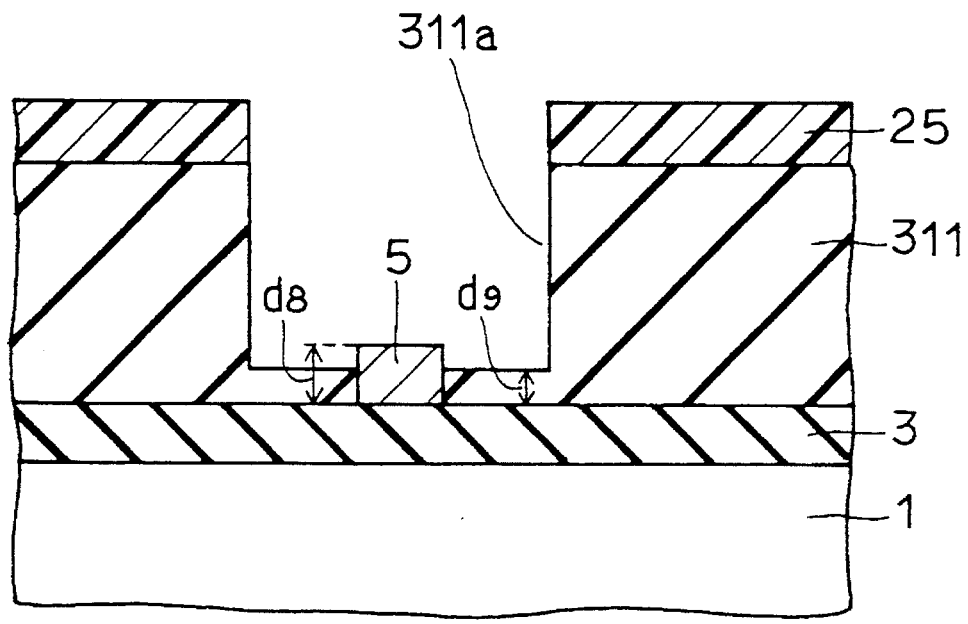

FIGS. 37A and 38A are cross sections corresponding to FIG. 36A, and FIGS. 37B and 38B are cross sections corresponding to FIG. 36B.

Referring first to FIGS. 37A and 37B, insulating layer 3 made of, e.g., the element isolating oxide film is formed on the surface of p-type semiconductor substrate 1. Connection conductive layer 5 made of, e.g., the polycrystalline silicon is formed by patterning on the surface of insulating layer 3. Insulating layer 311 made of, e.g., the silicon oxide film is formed to cover connection conductive layer 5.

Referring to FIGS. 38A and 38B, resist pattern 25 having a predetermined configuration is formed on the surface of insulating layer 311. Using resist pattern 25 as a mask, anisotropic etching is effected on insulating layer 311. This anisotropic etching must be performed only to an extent that at least the upper surface of connection conductive layer 5 is exposed. Thereafter, resist pattern 25 is removed, and silicon oxide film 313 of about 5000Å in thickness is formed on the inner wall of hole 311a and the whole surface of insulating layer 301 to cover connection conductive layer 5. Thereby, the semiconductor device shown in FIGS. 36A and 36B is completed.

Operation of the fuse blow in this embodiment will be described below.

Figure 39A:
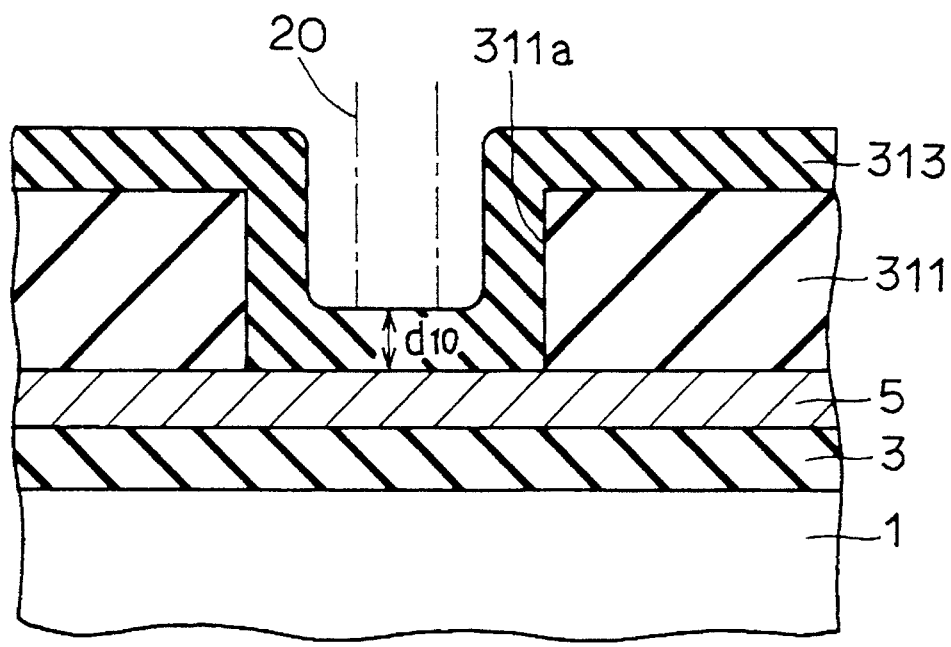
FIGS. 39A and 40A are schematic cross sections corresponding to the cross section of FIG. 36A and showing fuse blow operation in the semiconductor device of the fifth embodiment of the invention in accordance with the order of steps.
Figure 39B:
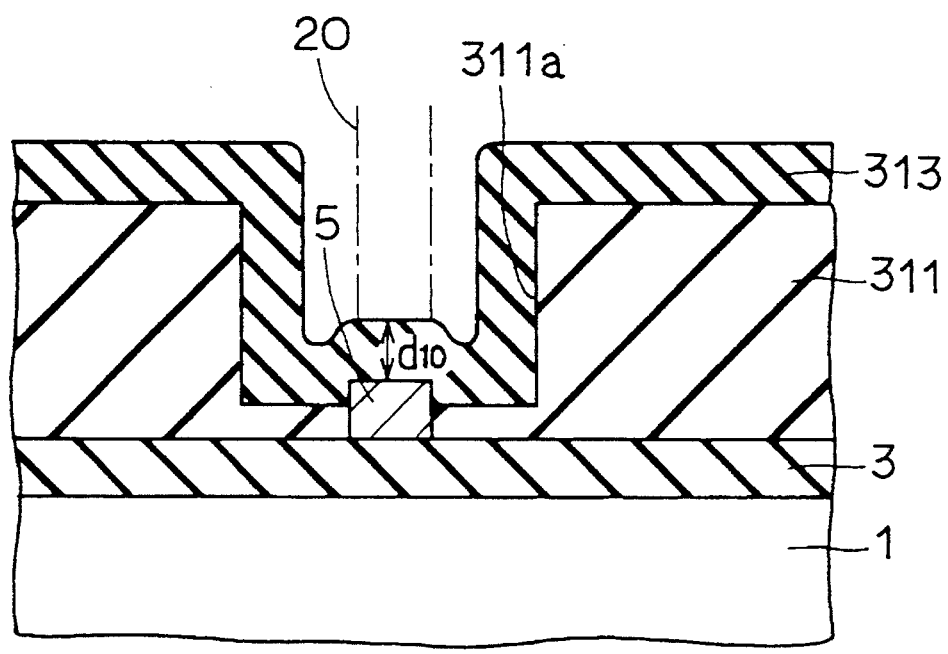
FIGS. 39B and 40B are schematic cross sections corresponding to the cross section of FIG. 36B and showing fuse blow operation in the semiconductor device of the fifth embodiment of the invention in accordance with the order of steps.
Figure 40A:
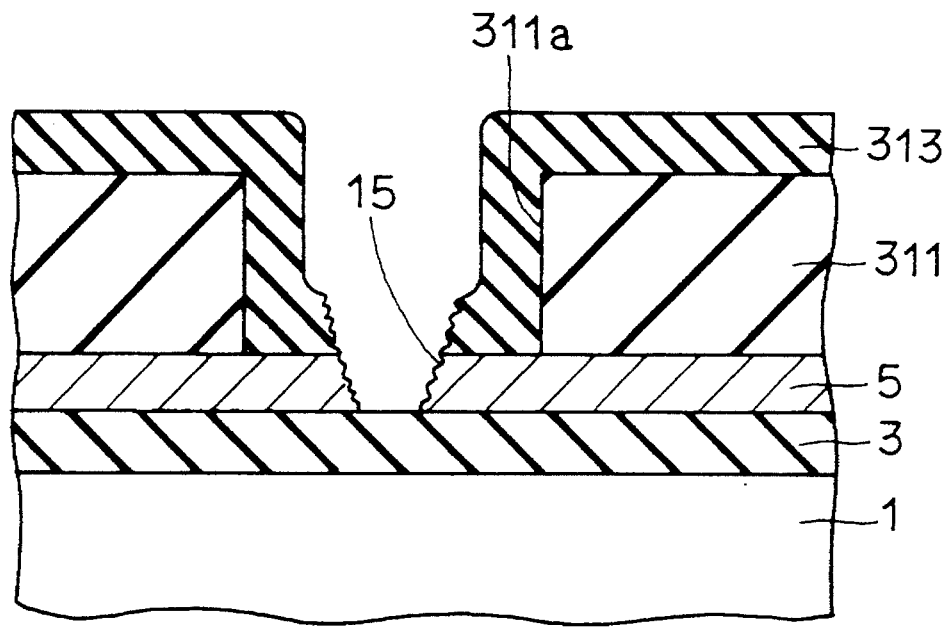
Figure 40B:
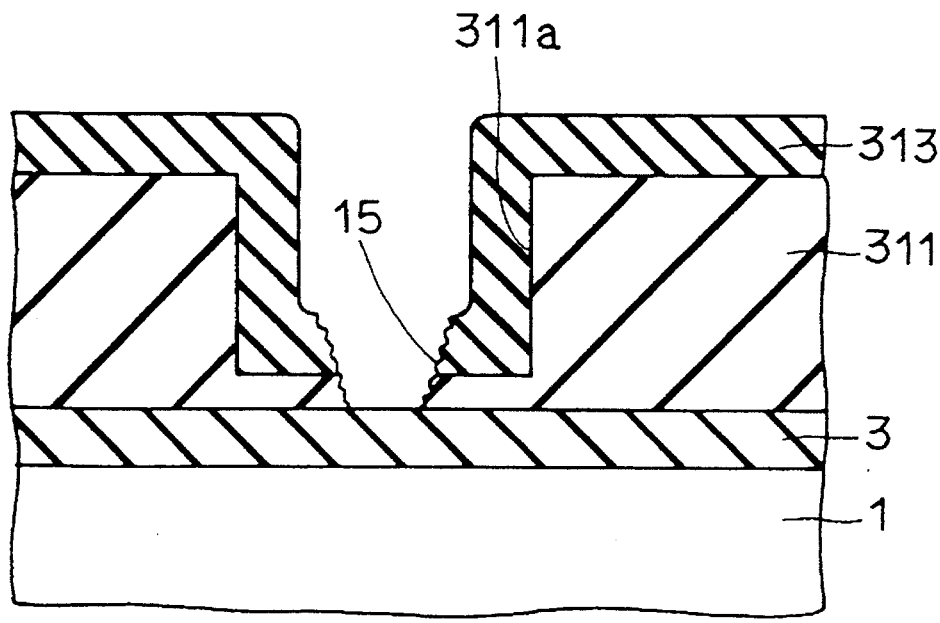

FIGS. 39A and 40A are cross sections corresponding to FIG. 36A, and FIGS. 39B and 40B are cross sections corresponding to FIG. 36B.

Referring to FIGS. 39A and 39B, laser beam 20 is radiated to insulating layer 313 located immediately above connection conductive layer 5. Laser beam 20 passes through insulating layer 313 and reaches connection conductive layer 5. Thereby, the pressure increases at the vicinity of connection conductive layer 5 to blow off insulating layer 313.

Also, as shown in FIGS. 40A and 40B, connection conductive layer 5 is partially vaporized to blow off insulating layer 313, so that crater 15 is formed. In this manner, connection conductive layer 5 is cut.

In the method of manufacturing the semiconductor device of this embodiment, the upper surface of connection conductive layer 5 is exposed at the bottom of hole 311a, and then insulating layer 313 is formed on connection conductive layer 5, whereby the film thickness of insulating layer 313 on connection conductive layer 5 is controlled.

According to this method, it is necessary to etch insulating layer 311 to expose the upper surface of connection conductive layer 5 at the bottom of hole 311a. In this etching, it is necessary only to expose the upper surface of connection conductive layer 5, and it makes no matter whether the side wall of connection conductive layer 5 is exposed or not. Therefore, the etched amount in this etching can be controlled very easily.

Insulating layer 313 of a predetermined thickness is formed on the exposed upper surface of connection conductive layer 5 by the CVD method or the like. According to this CVD method, the amount (thickness) of film formed thereby can be controlled more easily than the control of etched amount. Thus, fluctuation of the film thickness in the case of forming the film of 1000Å in thickness by the CVD method is smaller than that of the etched amount in the case where the etching is performed to obtain the film thickness of 1000Å. Therefore, the film thickness of insulating layer 313 on connection conductive layer 5 can be controlled easily by forming insulating layer 313 by the CVD method as compared with the conventional case where the film thickness $d_{20}$ of insulating layer 511 on connection conductive layer 505 is controlled by the etching.

In the conventional case where the film thickness is controlled by the etching, the etched amount and hence fluctuation thereof increases as the film thickness of insulating layer 511 increases. Meanwhile, in this embodiment, it is required only to form insulating layer 313, which has a predetermined film thickness suitable to the fuse blow, on connection conductive layer 5. Also from this point, this embodiment allows easy control of the film thickness of the insulating layer on the connection conductive layer as compared with the prior art.

In the semiconductor device of this embodiment, since insulating layer 313 on connection conductive layer 5 has a predetermined film thickness, the fuse blow can be performed correctly.

Also in the semiconductor device of this embodiment, the following remarkable advantage can be achieved if insulating layer 313 is made of material providing a parasitic capacitance smaller than that of the silicon nitride film.

Figure 41A:
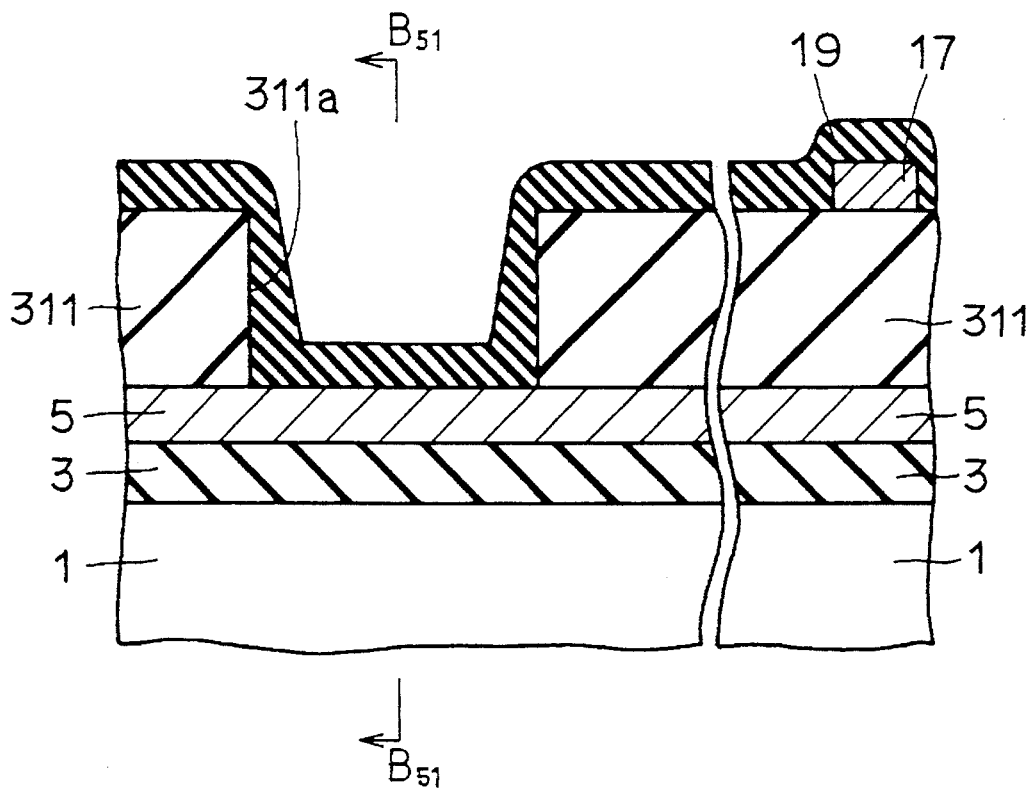
FIGS. 41A and 42A are schematic cross sections corresponding to the cross section of FIG. 36A and showing a disadvantage caused by a structure not provided with an insulating layer 313.
Figure 41B:
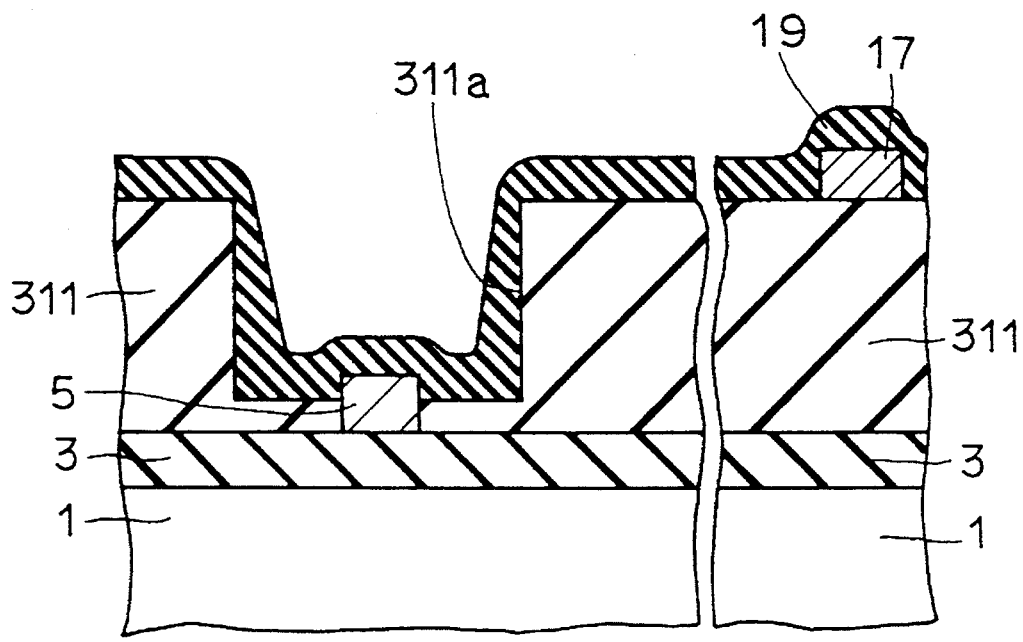
FIGS. 41B and 42B are schematic cross sections corresponding to the cross section of FIG. 36A and showing an advantage attained by a structure provided with the insulating layer 313.

FIG. 41B is a schematic cross section taken along line $B_{51}$—$B_{51}$ in FIG. 41A. Referring to FIGS. 41A and 41B, passivation film 19 is generally formed of a silicon nitride film. Interconnection layer 17 is generally formed on insulating layer 313. Therefore, if insulating layer 313 is eliminated from the structure shown in FIG. 36B, silicon nitride film 19 is in direct contact with interconnection layer 5. Silicon nitride film 19 is made of material which is likely to provide a parasitic capacitance with respect to interconnection layer 5 if the silicon nitride film 19 is in contact with interconnection layer 5. If such a parasitic capacitance is caused, a part of electric charges moving in interconnection layer 5 stop at the vicinity of the contact between interconnection layer 5 and silicon nitride film 19 to form the parasitic capacitance. As the parasitic capacitance generates, the electric charges moving in the interconnection layer 5 decreases in number, so that a signal to be sent to a subsequent stage is weakened. This results in disadvantages, for example, that the element in the subsequent stage cannot discriminate the signal.

Figure 55:
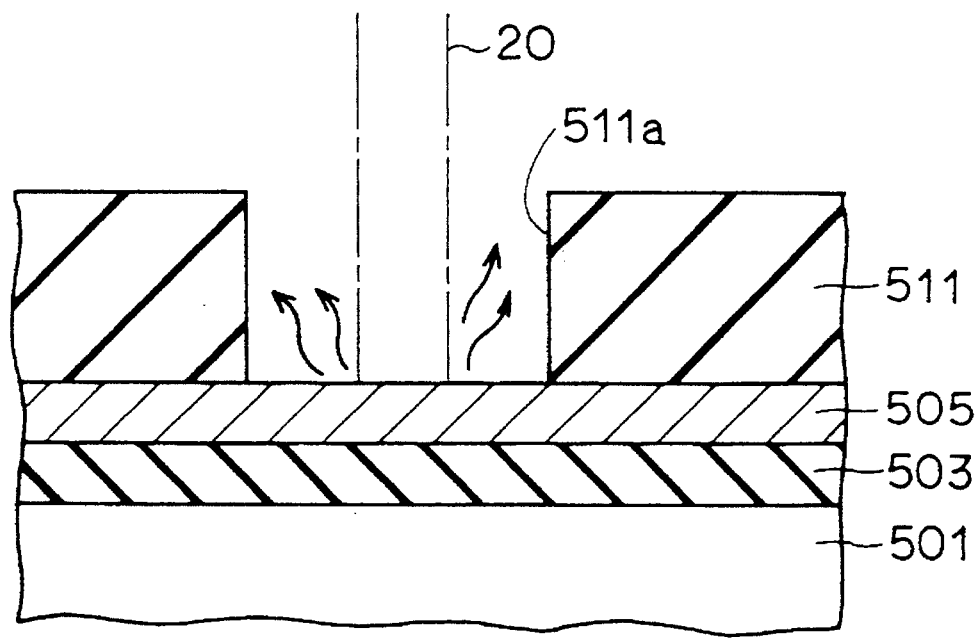
FIG. 55 is a schematic cross section showing a disadvantage caused by the thin insulating layer 511.
Figure 56:
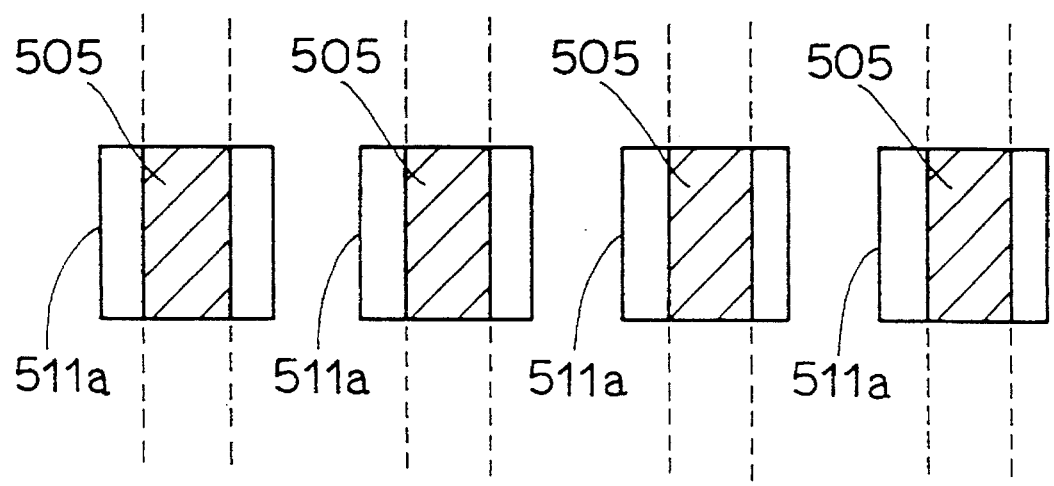
FIG. 56 is a schematic plan showing a disadvantage caused by the thin insulating layer 511 and an exposed connection conductive layer 505.

If insulating layer 313 is merely eliminated, blow of connection conductive layer 5, i.e., fuse blow cannot be performed as already described with reference to FIGS. 55 and 56. Meanwhile, the fuse blow is allowed even in the structure not provided with insulating layer 313, if the fuse blow is performed after formation of connection conductive layer 5. In this case, however, the section of cut connection conductive layer 5 after fuse blow is exposed through passivation film 19, which may reduce the reliability.

Figure 42A:
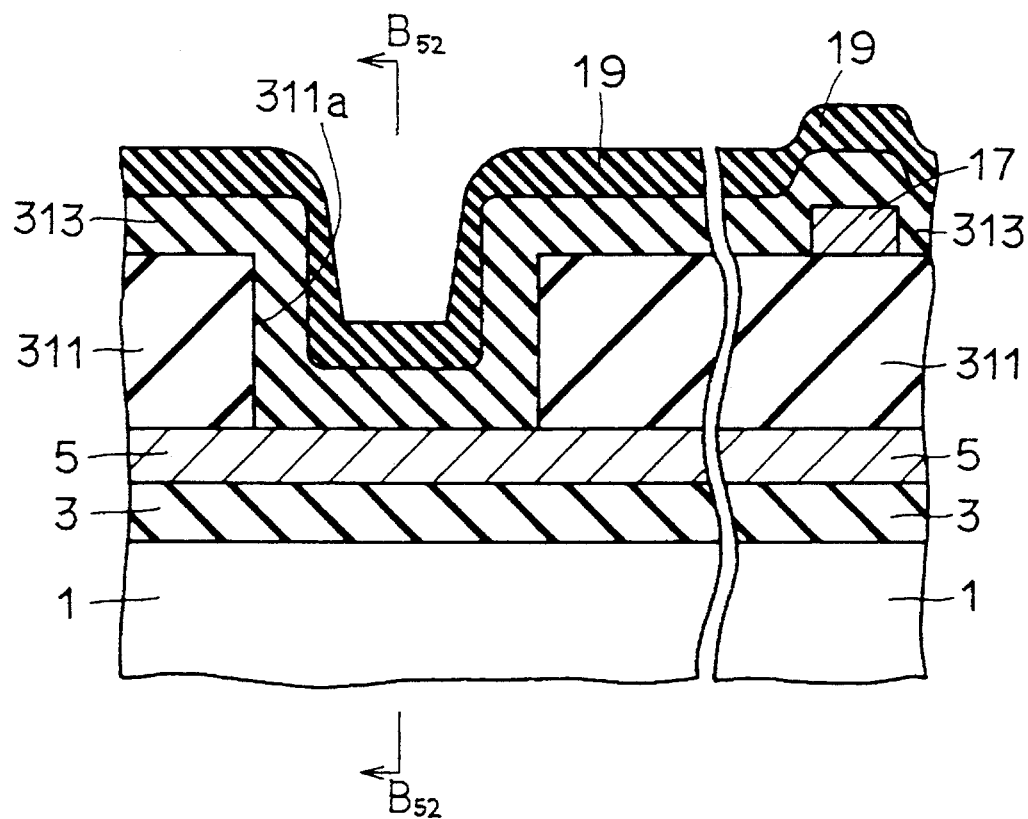
Figure 42B:
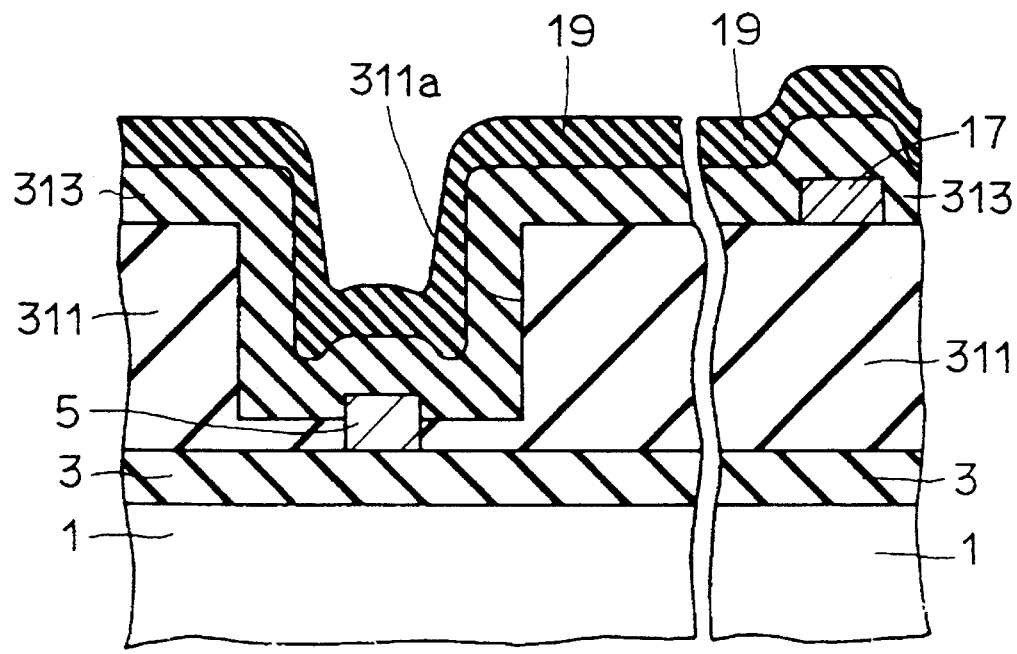
Figure 43:
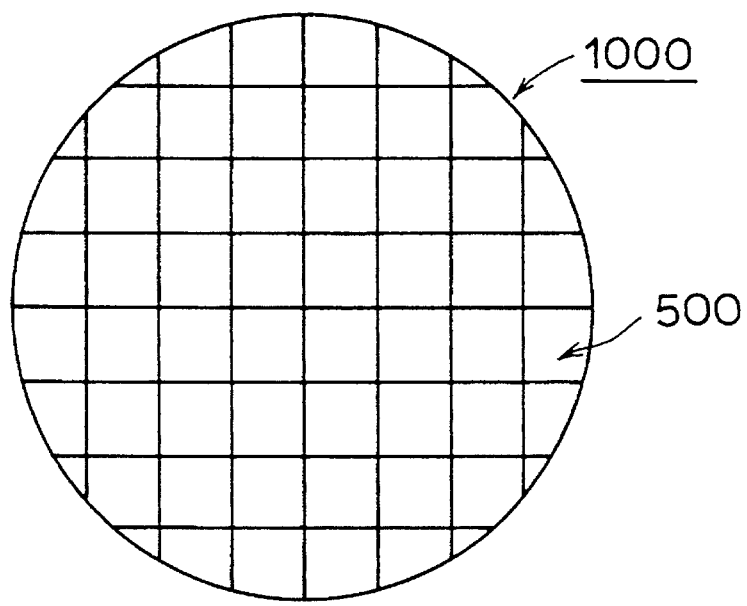
FIG. 43 is a plan schematically showing a structure of a wafer.
Figure 44:
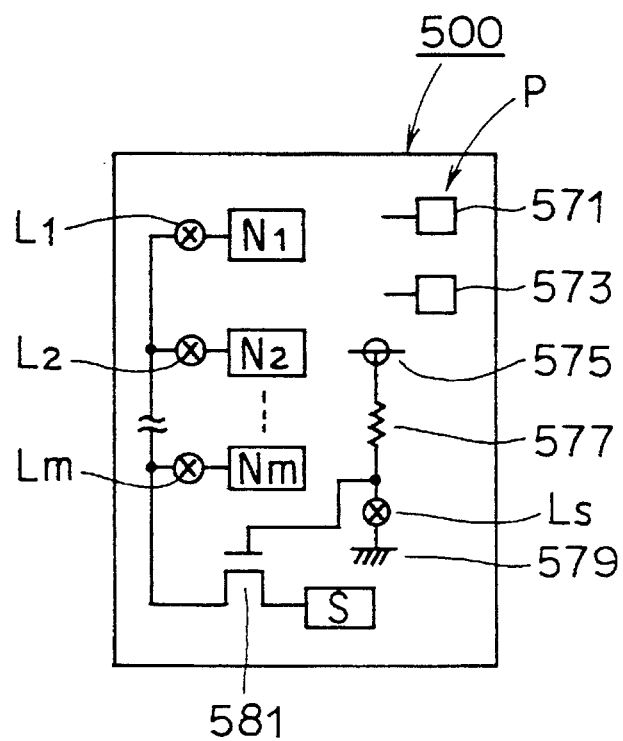
FIG. 44 is a schematic plan showing a structure of a chip provided with an redundant circuit.
Figure 45:
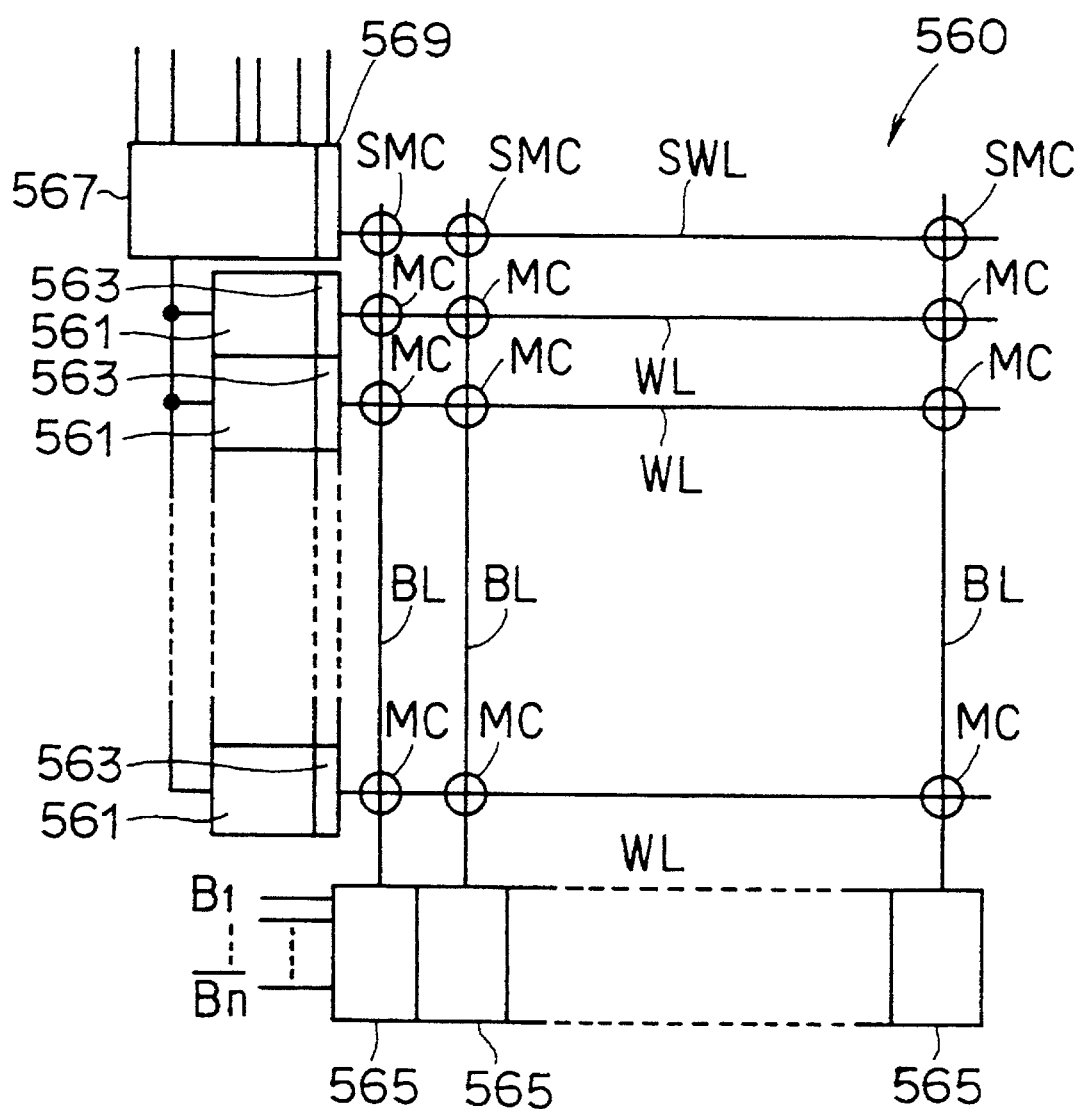
FIG. 45 is a block diagram schematically showing structures of a memory cell array provided with a redundant circuit and its peripheral circuitry.
Figure 46:
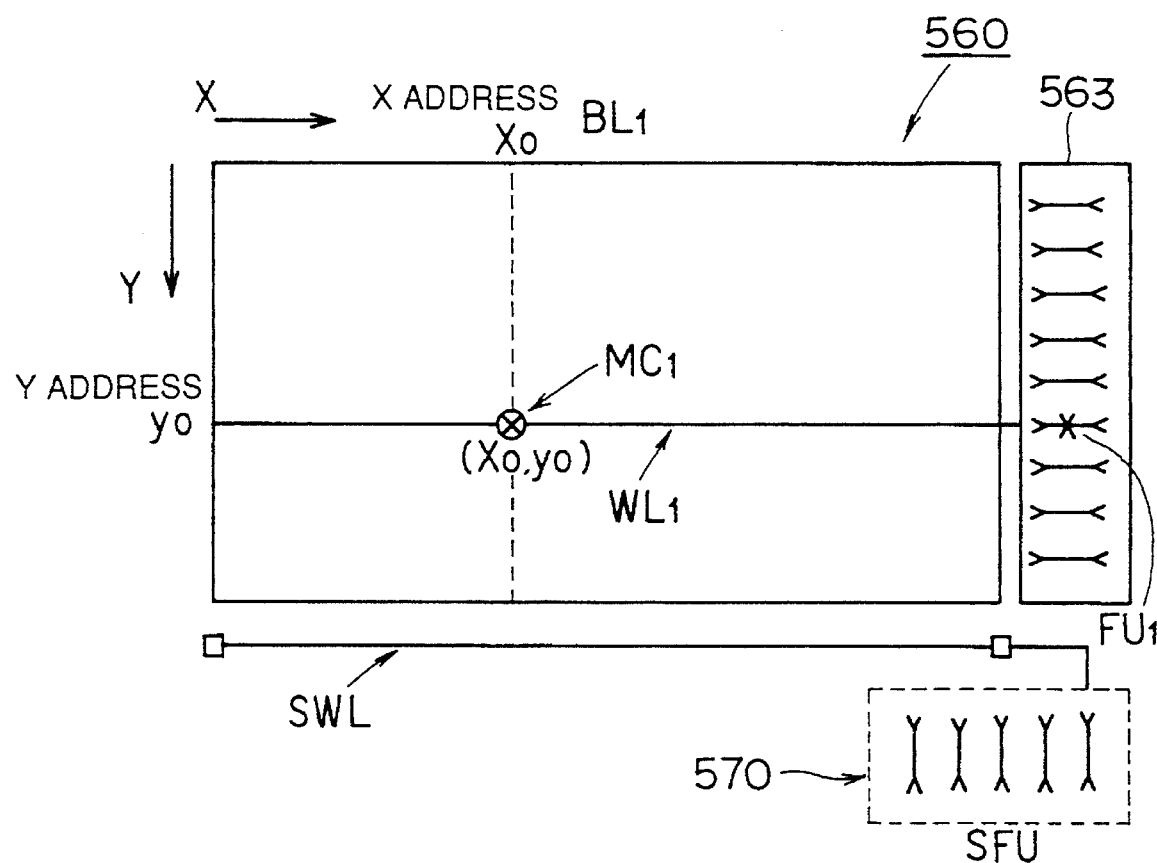
FIG. 46 is a diagram schematically showing replacement with the redundant circuit.
Figure 47:
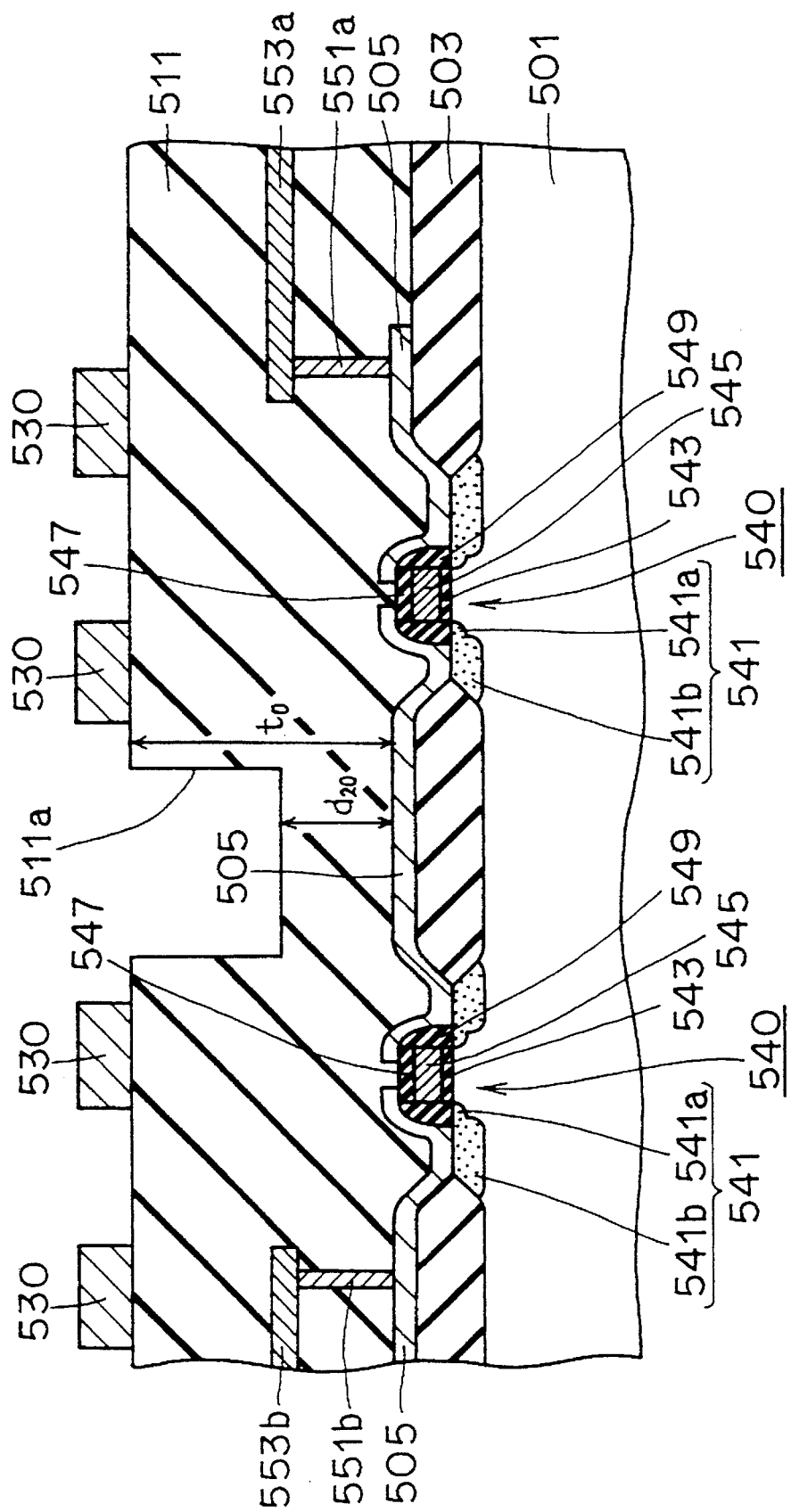
FIG. 47 is a cross section schematically showing a structure of a conventional semiconductor device.
Figure 48:
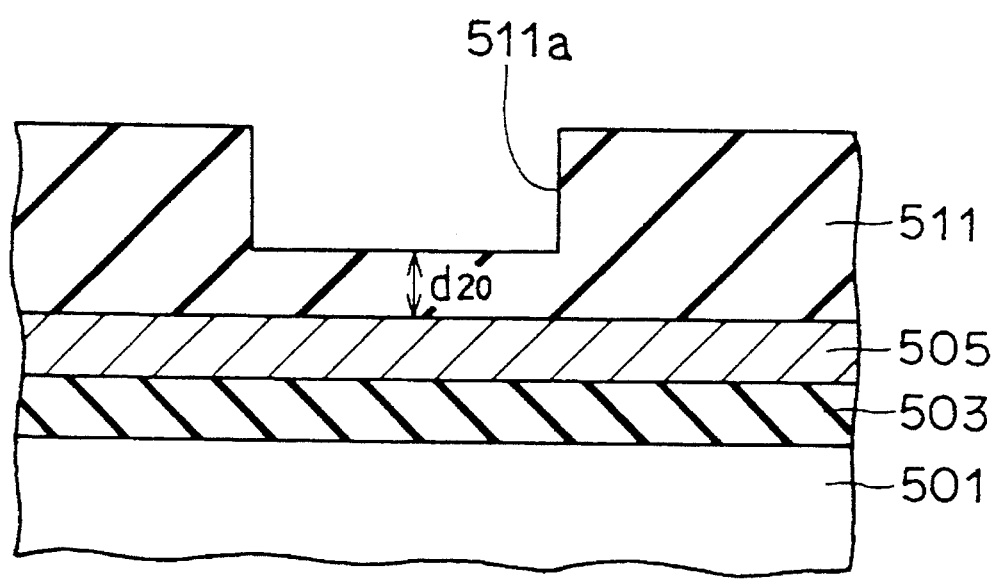
FIG. 48 is a cross section schematically showing a structure near a fuse element in FIG. 47.
Figure 49:
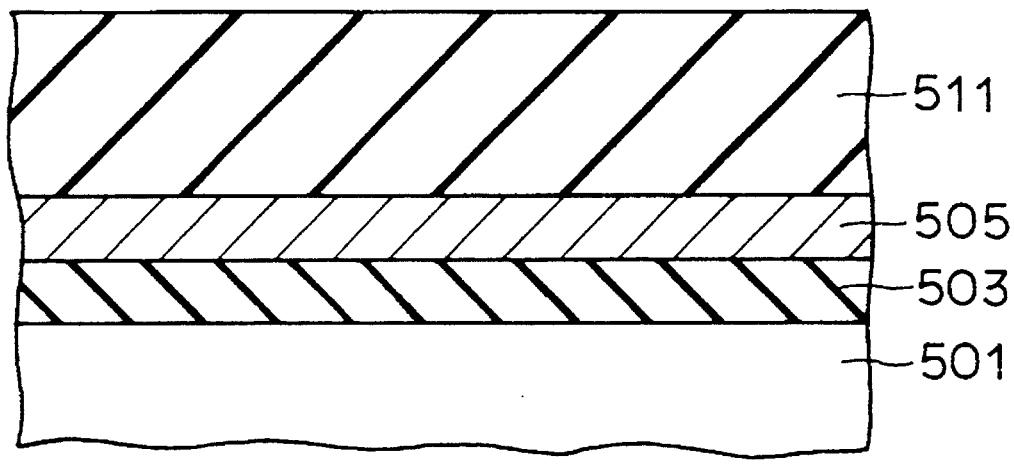
FIGS. 49 and 50 are schematic cross sections showing a method of manufacturing the conventional semiconductor device in accordance with the order of steps.
Figure 50:
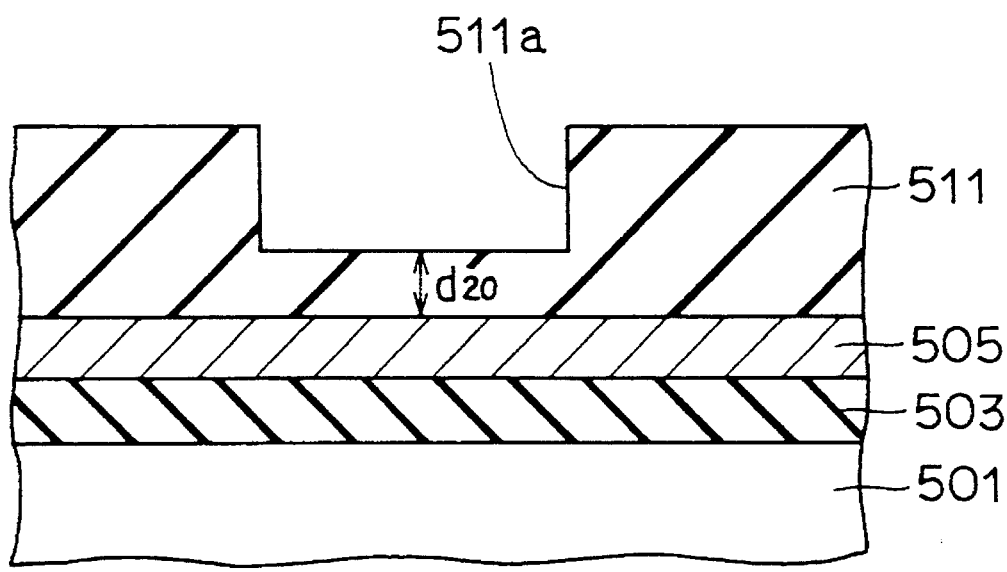
Figure 51:
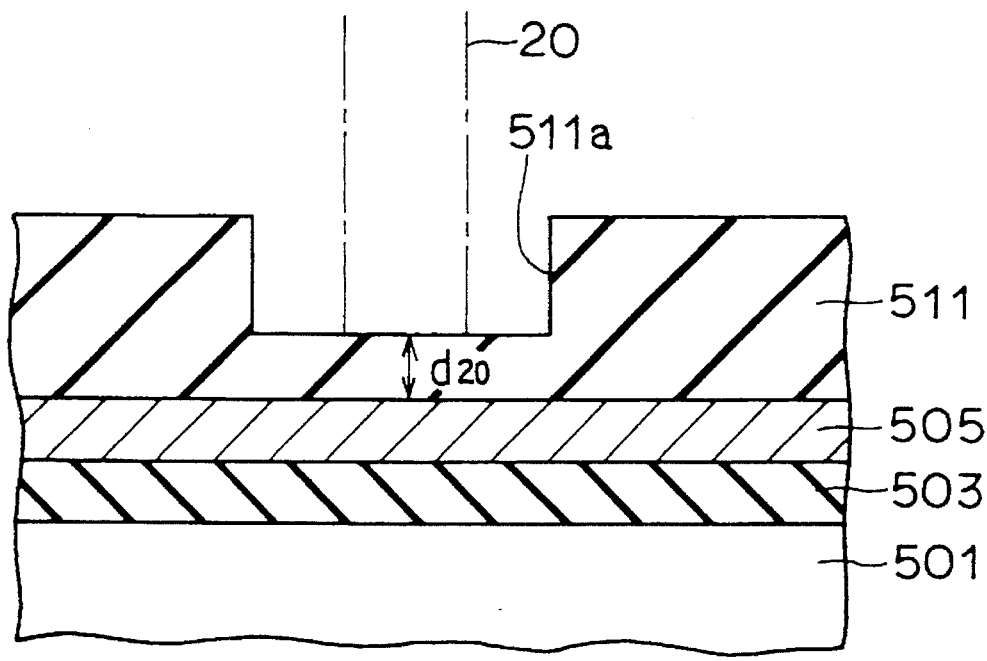
FIGS. 51 and 52 are schematic cross sections showing fuse blow operation in the conventional semiconductor device in accordance with the order of steps.
Figure 52:
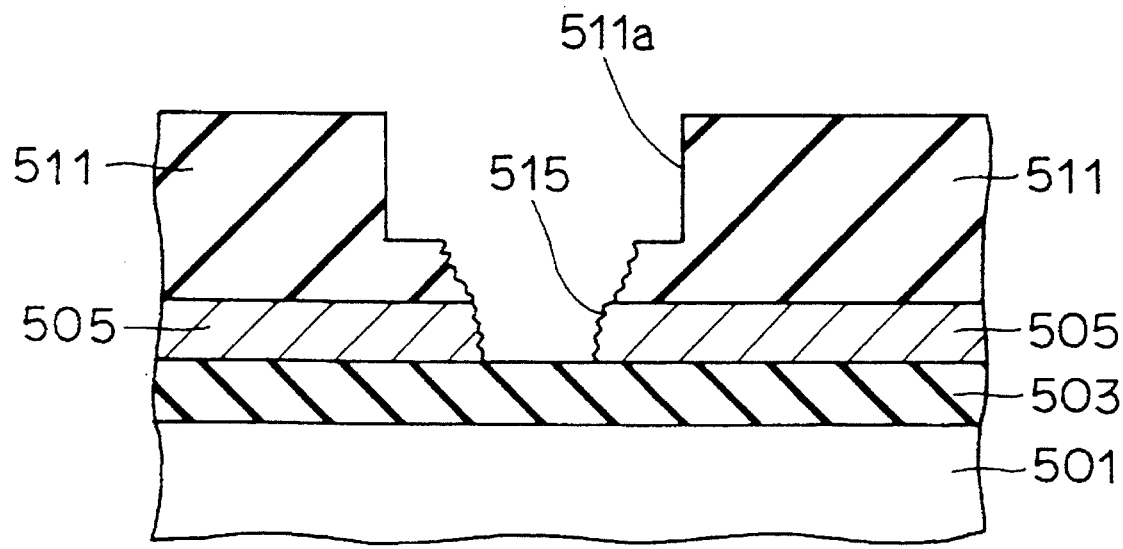
Figure 53:
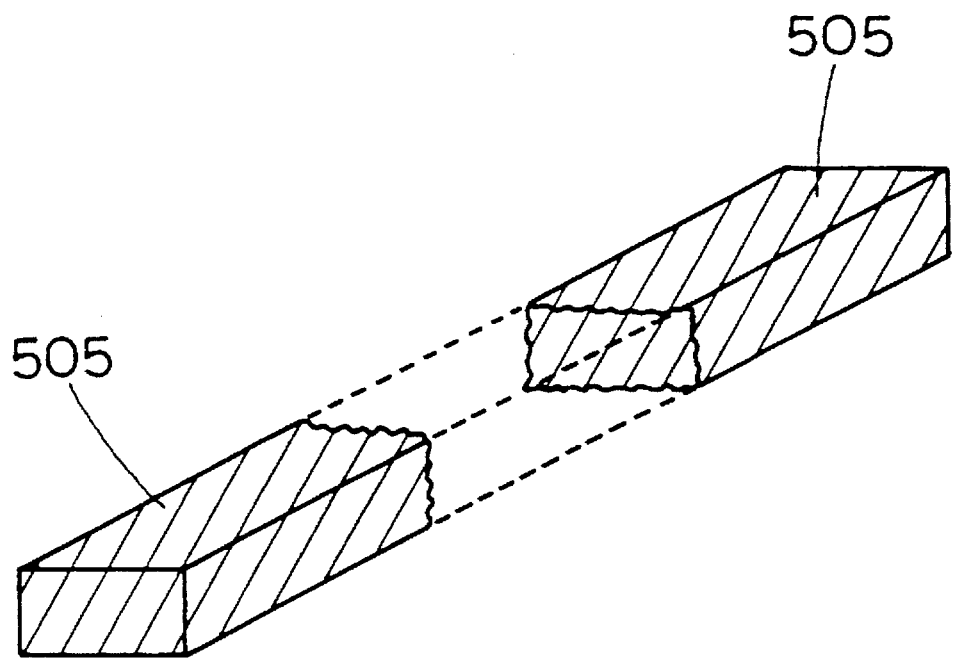
FIG. 53 is a perspective view schematically showing a connection conductive layer after cutting.
Figure 54:
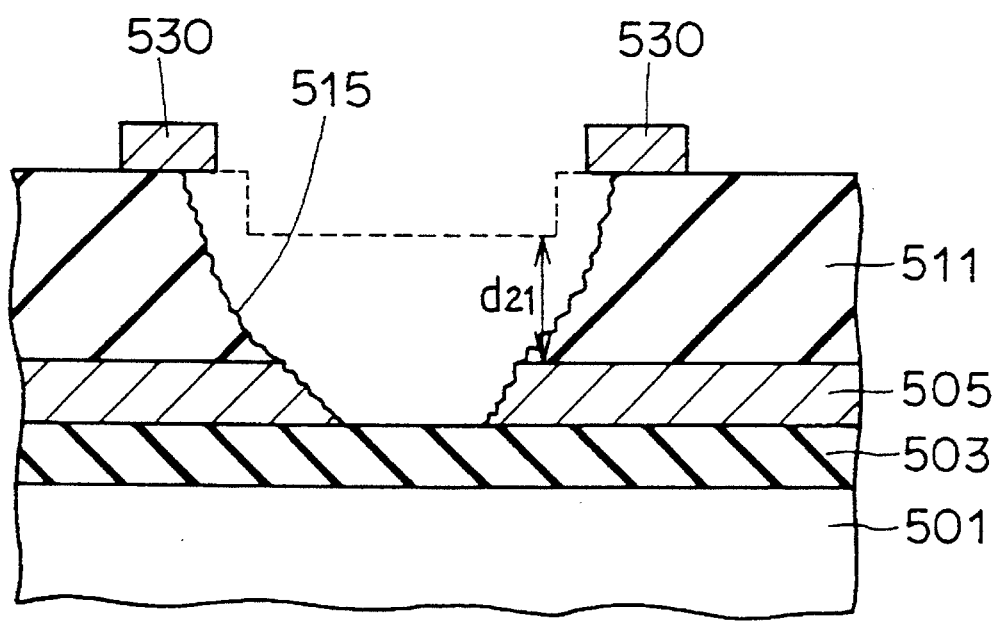
FIG. 54 is a schematic cross section showing a disadvantage caused by a thick insulating layer 511.

In the semiconductor device of this embodiment, interconnection layer 5 is covered with insulating layer 313 as shown in FIGS. 42A and 42B. Thus, insulating layer 313 is interposed between interconnection layer 5 and passivation film 19. Therefore, insulating layer 313 can be made of material providing a parasitic capacitance smaller than that of the silicon nitride film forming passivation film 19, whereby the parasitic capacitance generated with respect to interconnection layer 5 can be reduced. Therefore, the foregoing disadvantage caused by the parasitic capacitance can be suppressed.

In the method of manufacturing the semiconductor device having the redundant circuit of one aspect of the invention, the films having different etching characteristics are formed in a layered fashion immediately on the connection conductive layer. Therefore, the film thickness of insulating layer on the connection conductive layer can be controlled easily.

In the semiconductor device of one aspect of the invention manufactured by the aforementioned method, since the silicon nitride film is formed immediately on the connection conductive layer, corrosion of the connection conductive layer by moisture can be prevented, resulting in improvement of reliability in the electrical connection. Also, it is possible to prevent the short-circuit of cut connection conductive layer by moisture.

In the method of manufacturing the semiconductor device having the redundant circuit of another aspect of the invention, the film thickness of the insulating layer on the connection conductive layer can be controlled easily, as can be done by the method of manufacturing the semiconductor device of the aforementioned aspect.

Since the conductive layer used as the etching stopper layer is entirely removed, the conductive layer does not exist when disconnecting the connection conductive layer. Therefore, there is no possibility that short-circuit of the cut connection conductive layer is caused by the residual conductive layer.

In the semiconductor device of another aspect of the invention manufactured by the aforementioned method, the open diameter of the bottom of the hole located immediately above the connection conductive layer is larger than the open diameter of the hole at and near the open end. Therefore, it is possible to prevent the connection conductive layer from being damaged and broken by the crater formed by disconnection.

In the method of manufacturing the semiconductor device having the redundant circuit of still another aspect of the invention, the film thickness of the insulating layer on the connection conductive layer can be controlled easily as can be done by the manufacturing method of the aforementioned aspect of the invention.

In the semiconductor device having the redundant circuit of still another aspect of the invention manufactured by the aforementioned method, the surface of the conductive layer faced to the side wall of the aperture is covered with the side wall insulating layer. Therefore, short-circuit of the cut connection conductive layer by the conductive layer is prevented.

In the method of manufacturing the semiconductor device having the redundant circuit of yet another aspect of the invention, the laser beam is radiated to the convex portion, i.e., thick portion, and the convex portion is surrounded by the thin portion, i.e., concave portion. Therefore, energy consumption for breaking the connection conductive layer can be reduced.

In the method of manufacturing the semiconductor device having the redundant circuit according to further another aspect of the invention, the second insulating layer is formed on the connection conductive layer to control the film thickness of the insulating layer on the connection conductive layer. Therefore, the film thickness of the insulating layer on the connection conductive layer can be controlled easily.

In the semiconductor device having the redundant circuit of still further another aspect of the invention manufactured by the aforementioned aspect, the connection conductive layer can be cut in a desirable manner.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device which includes a specific circuit portion having at least a predetermined function and a redundant circuit portion for spare use having the same function as said specific circuit portion, and is provided with a connection portion which can be fused and removed for replacing said specific circuit portion, if defective, with said redundant circuit portion, said semiconductor device having said redundant circuit comprising:

a semiconductor substrate having a main surface;

a connection conductive layer formed on the main surface of said semiconductor substrate by patterning and which can be fused and removed;

a silicon nitride film formed on said connection conductive layer; and a silicon oxide film located immediately above said connection conductive layer, formed on the main surface of said semiconductor substrate and having a hole reaching a surface of said silicon nitride film.

2. The semiconductor device according to claim 1, further comprising an insulating layer covering said connection conductive layer, said silicon nitride film being formed on said insulating layer.

3. A semiconductor device which includes a specific circuit portion having at least a predetermined function and a redundant circuit portion for spare use having the same function as said specific circuit portion, and is provided with a connection portion which can be fused and removed for replacing said specific circuit portion, if defective, with said redundant circuit portion, said semiconductor device having said redundant circuit comprising:

a semiconductor substrate having a main surface;

a connection conductive layer formed on the main surface of said semiconductor substrate by patterning and can be fused and removed; and an insulating layer formed on the main surface of said semiconductor substrate, covering said connection conductive layer and provided with a hole having a bottom located immediately above said connection conductive layer with a predetermined distance therebetween, wherein said hole has an open end located at an upper surface of said insulating layer, and an open diameter of said hole at said open end is smaller than an open diameter of said hole at its bottom side.

4. The semiconductor device according to claim 3, wherein the bottom of said hole comprises a circumferential groove having a diameter greater than the diameter of said hole at said open end, said groove being spaced by a predetermined distance from said connection conductive layer.

5. A semiconductor device which includes a specific circuit portion having at least a predetermined function and a redundant circuit portion for spare use having the same function as said specific circuit portion, and is provided with a connection portion which can be fused and removed for replacing said specific circuit portion, if defective, with said redundant circuit portion, said semiconductor device having said redundant circuit comprising:

a semiconductor substrate having a main surface;

a connection conductive layer formed on the main surface of said semiconductor substrate by patterning and can be fused and removed;

an insulating layer formed on the main surface of said semiconductor substrate, covering said connection conductive layer and provided with a hole having a bottom located immediately above said connection conductive layer with a predetermined distance therebetween, a conductive layer surrounding a side wall of said hole and having a surface faced to the side wall of said hole; and a side wall insulating layer formed on a portion of the bottom of said hole and covering the side wall of said hole.

6. The semiconductor device according to claim 5, wherein said side wall insulating layer includes a silicon nitride film.

7. A semiconductor device which includes a specific circuit portion having at least a predetermined function and a redundant circuit portion for spare use having the same function as said specific circuit portion, and is provided with a connection portion which can be fused and removed for replacing said specific circuit portion, if defective, with said redundant circuit portion, said semiconductor device having said redundant circuit comprising:

a semiconductor substrate having a main surface;

a connection conductive layer formed on the main surface of said semiconductor substrate by patterning and can be fused and removed; and an insulating layer formed on the main surface of said semiconductor substrate, covering said connection conductive layer and provided with a hole having a bottom located immediately above said connection conductive layer with a predetermined distance therebetween, wherein said hole is provided at its bottom with a convexity and a concavity, said convexity is spaced by a first distance from said connection conductive layer, and said concavity surrounds said convexity and is spaced from said connection conductive layer by a second distance smaller than said first distance.

8. A semiconductor device which includes a specific circuit portion having at least a predetermined function and a redundant circuit portion for spare use having the same function as said specific circuit portion, and is provided with a connection portion which can be fused and removed for replacing said specific circuit portion, if defective, with said redundant circuit portion, said semiconductor device having said redundant circuit comprising:

a semiconductor substrate having a main surface;

a connection conductive layer formed on the main surface of said semiconductor substrate by patterning and which can be fused and removed;

a first insulating layer formed on the main surface of said semiconductor substrate and having a hole, a surface of said connection conductive layer protruding through said hole; and a second insulating layer covering a protruding surface of said connection conductive layer, wherein said second insulating layer is in direct contact with the surface of said connection conductive layer protruding through said first insulating layer at the bottom wall of said hole.

9. The semiconductor device according to claim 8, further comprising a passivation film formed on said second insulating layer.

* * * * *